United States Patent
Ray et al.

(10) Patent No.: US 10,429,491 B2
(45) Date of Patent: Oct. 1, 2019

(54) SYSTEMS AND METHODS FOR PULSE DESCRIPTOR WORD GENERATION USING BLIND SOURCE SEPARATION

(71) Applicants: THE BOEING COMPANY, Chicago, IL (US); HRL LABORATORIES, LLC, Malibu, CA (US)

(72) Inventors: Gary Alan Ray, Issaquah, WA (US); Peter Petre, Oak Park, CA (US); Charles E. Martin, Thousand Okas, CA (US); Shankar R. Rao, Agoura Hills, CA (US)

(73) Assignees: THE BOEING COMPANY, Chicago, IL (US); HRL LABORATORIES, LLC, Malibu, CA (US)

( * ) Notice: Subject to any disclaimer, the term of this patent is extended or adjusted under 35 U.S.C. 154(b) by 257 days.

(21) Appl. No.: 15/262,987

(22) Filed: Sep. 12, 2016

(65) Prior Publication Data

US 2018/0074171 A1    Mar. 15, 2018

(51) Int. Cl.
*G01S 7/292*    (2006.01)
*G01S 7/02*    (2006.01)
(Continued)

(52) U.S. Cl.
CPC ............ *G01S 7/2923* (2013.01); *G01S 7/006* (2013.01); *G01S 7/021* (2013.01); *G01S 13/66* (2013.01); *G01R 23/155* (2013.01)

(58) Field of Classification Search
CPC ........ G01S 7/2923; G01S 7/021; G01S 7/006; G01S 13/66; G01R 23/155; G06K 9/624; G06K 9/00516; G06K 9/6243
See application file for complete search history.

(56) References Cited

U.S. PATENT DOCUMENTS 5,179,529 A    1/1993    Nowakowski
5,263,051 A    11/1993    Eyuboglu
(Continued)

FOREIGN PATENT DOCUMENTS

EP    2988148 A1    2/2016
JP    2001264417 A    9/2001
(Continued)

OTHER PUBLICATIONS

Mark Wickert, ECE2610 Signals and Systems lecture notes, Chapter 8 IIR Filters, Apr. 19, 2010.
(Continued)

*Primary Examiner* — Bernarr E Gregory
(74) *Attorney, Agent, or Firm* — Armstrong Teasdale LLP

(57) ABSTRACT

A method for generating pulse descriptor words (PDWs) including frequency and/or bandwidth data from time-varying signals received by a sensor includes filtering, at a plurality of blind source separation (BSS) modules, signals derived from the time-varying signals, each BSS module including a filtering subsystem having a plurality of filter modules. Each filter module has a frequency filter coefficient ($\alpha$) and is parameterized by a center frequency (f). The method also includes transmitting at least one blind source separated signal from the BSS modules to a PDW generation module communicatively coupled to the filtering subsystem. The method further includes generating, using the PDW generation module and based on the blind source separated signal, at least one PDW parameter vector signal containing the frequency data. The method also includes updating, upon generating and based on the PDW parameter vector signal, values of $\alpha$ and/or f for each filter module.

18 Claims, 17 Drawing Sheets

(51) Int. Cl.
*G01S 7/00* (2006.01)
*G01S 13/66* (2006.01)
*G01R 23/15* (2006.01)
*G01S 13/00* (2006.01)

(56) References Cited

U.S. PATENT DOCUMENTS

| | | | |
|---|---|---|---|
| 5,754,783 | A | 5/1998 | Mendelson et al. |
| 5,889,791 | A | 3/1999 | Yang |
| 5,999,129 | A | 12/1999 | Rose |
| 6,041,393 | A | 3/2000 | Hsu |
| 6,043,771 | A | 3/2000 | Clark et al. |
| 6,147,646 | A | 11/2000 | Arneson et al. |
| 6,205,190 | B1 | 3/2001 | Antonio et al. |
| 6,285,319 | B1 | 9/2001 | Rose |
| 6,351,456 | B1 | 2/2002 | Struhsaker et al. |
| 6,545,633 | B1 | 4/2003 | Jensen |
| 6,711,528 | B2 * | 3/2004 | Dishman ............... G06K 9/624 324/309 |
| 6,744,744 | B1 | 6/2004 | Tong et al. |
| 6,898,612 | B1 * | 5/2005 | Parra ............... G06K 9/6243 704/E21.012 |
| 6,985,102 | B1 | 1/2006 | Horn et al. |
| 7,397,415 | B1 * | 7/2008 | Wang ............... G01S 7/021 342/13 |
| 8,805,858 | B1 | 8/2014 | Ray |
| 8,958,750 | B1 * | 2/2015 | Saleem ............... G06K 9/00516 455/62 |
| 9,081,092 | B1 | 7/2015 | Friesel |
| 9,273,965 | B2 | 3/2016 | Cody et al. |
| 2002/0035709 | A1 | 3/2002 | Chen et al. |
| 2002/0121890 | A1 | 9/2002 | Levitt |
| 2002/0168035 | A1 | 11/2002 | Carlson et al. |
| 2003/0023909 | A1 | 1/2003 | Ikeda et al. |
| 2003/0079170 | A1 | 4/2003 | Stewart et al. |
| 2003/0095716 | A1 | 5/2003 | Gindele et al. |
| 2003/0096586 | A1 | 5/2003 | Oates et al. |
| 2003/0221084 | A1 | 11/2003 | Zhou |
| 2004/0027257 | A1 | 2/2004 | Yannone et al. |
| 2004/0158821 | A1 * | 8/2004 | Rickard ............... G06K 9/624 717/136 |
| 2004/0204922 | A1 * | 10/2004 | Beadle ............... G06K 9/624 702/189 |
| 2008/0198914 | A1 | 8/2008 | Song |
| 2009/0060008 | A1 | 3/2009 | Beadle |
| 2010/0309055 | A1 | 12/2010 | Middour et al. |
| 2011/0178979 | A1 | 7/2011 | Nakagawa et al. |
| 2012/0280848 | A1 | 11/2012 | Card et al. |
| 2013/0021197 | A1 | 1/2013 | Jiang |
| 2014/0354647 | A1 | 12/2014 | Verrett |
| 2016/0314097 | A1 | 10/2016 | Bradford |

FOREIGN PATENT DOCUMENTS

| | | | | |
|---|---|---|---|---|
| JP | | 2015187575 A | 10/2015 | |
| WO | WO98/58450 A1 * | | 12/1998 | ............. G06K 9/624 |

OTHER PUBLICATIONS

A. Kurzhanskiy & P. Varaiya, Ellipsoidal Toolbox Technical Report, 2006.

M. Friendly et al., Elliptical Insights: Understanding Statistical Methods through Elliptical Geometry, Statistical Science, vol. 28, No. 1, 1-39 (2013).

An FPGA Implementation of Incremental Clustering for Radar Pulse Deinterleaving, Scott Bailie, MS Thesis, Northeastern Univ., Apr. 2010.

S. Bailie & M. Leeser, Incremental applied to radar deinterleaving: a parameterized Fpga implementation, Fpga '12 Proceedings of the ACM/SIGDA international symposium on Field Programmable Gate Arrays, pp. 25-28, ISBN 978-1-4503-1155-7, abstract available at http://dl.acm.org/citation.cfm?id=2145699, Year 2012.

Pandu, J., Balaji, N., Naidu, C.D., FPGA implementation of multi parameter deinterleaving, 2014 International Conference on Electronics and Communications Systems (ICECS), Feb. 13-14, 2014, ISBN 978-1-4799-2320-5, abstract available at http://ieeexplore.ieee.org/document/6892676/.

Singh, A.K. & Rao, K.S., Detection, Identification & Classification of Intra Pulse Modulated LPI Radar Signal using Digital Receiver, International Journal of Emerging Technology and Advanced Engineering, vol. 2, Issue 9, Sep. 2012.

Kumar.N et al., Deinterleaving of Radar Signals and its Parameter Estimation in EW Environment, International Journal of Emerging Technology and Advanced Engineering, vol. 4, Issue 9, Sep. 2014.

Mahmoud et al., Radar Parameter Generation to Identify the Target, Journal of Engineering, vol. 17, Feb. 2011, available at http://www.iasj.net/iasj?func=fulltext&ald=24384.

Babcock et al., Sampling From a Moving Window Over Streaming Data, SODA '02 Proceedings of the thirteenth annual ACM-SIAM symposium on Discrete algorithms, pp. 633-634, abstract available at http://dl.acm.org/citation.cfm?id=545465, Year 2002.

Lakshmi et al., Detection and Extraction of Radio Frequency and Pulse Parameters in Radar Warning Receivers, Proceedings of International Conference on Emerging Research in Computing, Information , Communication an Applications (ERCICA 2013), Aug. 2013, ISBN 978-9-3510-7102-0, available at http://searchdl.org/public/book_series/elsevierst/1/97.pdf.

Guassianwaves.com—Signal Processing Simplified, Interleavers and deinterleavers, Oct. 25, 2010, http://www.gaussianwaves.com/2010/10/interleavers-and-deinterleavers-2/.

J.D. Parker, Deinterleaver Technology for Future Electronic Support Measures (ESM) Systems, Naval Surface Warfare Center, Dec. 1992, available at http://www.dtic.mil/dtic/tr/fulltext/u2/a265005.pdf.

U.S. Appl. No. 15/073,626, filed Mar. 17, 2016.

EPO Extended Search Report for related application 17181686.1 dated Aug. 21, 2017, 9 pp.

Lan-Da Van, Pipelining and Parallel Processing, Department of Computer Science National ChiaoTung University, Taiwan, 2010, Republic of China.

EPO Extended Search Report for related application 17181675.4 dated Aug. 17, 2017, 11 pp.

Extended European Search Report for Application No. 17174816.3, dated Jan. 9, 2018, 7 pages.

Extended European Search Report for Application No. 17179448.0. dated Jan. 19, 2018, 9 pages.

Jiang, L. et al., Pulse-Compression Radar Signal Sorting Using th Blind Source Separation Algrithms, 2015 International Conference on Estimation, Detection and Information Fusion, IEEE, pp. 268-271.

Shy, K. et al., Implementation of Pipelined FastICA on FPGA for Real-Time Blind Source Separation, Jun. 2008, IEEE Transaction on Neural Networks, vol. 19, No. 6, pp. 958-970.

European Office Action for Patent Application Serial No. 17 181 675.4-1217 dated Dec. 18, 2018; pp. 1-8.

* cited by examiner

SYSTEMS AND METHODS FOR PULSE DESCRIPTOR WORD GENERATION USING BLIND SOURCE SEPARATION

STATEMENT REGARDING FEDERALLY SPONSORED RESEARCH & DEVELOPMENT

This invention was made with Government support under N00014-12-C-0027 awarded by the Department of Defense. The government has certain rights in this invention.

BACKGROUND

The field of the disclosure relates generally to pulse descriptor word (PDW) vector signal processing, and, more specifically, to high performance systems and methods for PDW generation using blind source separation.

In known PDW vector signal processing systems and methods, fixed bandwidth channels are used to generate PDW vectors for deinterleaving into constituent PDW data blocks (e.g., parameters). In at least some known PDW vector signal processing systems, fixed bandwidth channels reduce accuracy of estimates of resultant PDW parameters such as estimated values of center frequency, bandwidth, pulse time, and pulse width of signals received from a plurality of target signal emitters (e.g., radar signals). In order to improve speed and accuracy for useful estimates of PDW parameter values, such fixed bandwidth channel-based PDW vector signal processing systems require larger and more complex processor architectures. Further, even when size, weight, and cost are not critical design constraints, at least some known systems and methods for PDW vector signal processing suffer from diminished efficiency and accuracy in continuously generating high quality PDW parameter vectors suitable for improved deinterleaving methods.

BRIEF DESCRIPTION

In one aspect, a method is provided for generating pulse descriptor words (PDWs) including at least one of frequency data and bandwidth data, from a plurality of time-varying signals received by a sensor communicatively coupled to a signal data processor. The method includes filtering, at a plurality of blind source separation (BSS) modules of the signal data processor, signals derived from the plurality of time-varying signals, each BSS module of the plurality of BSS modules including a filtering subsystem having a plurality of filter modules, where each filter module of the plurality of filter modules has a frequency filter coefficient ($\alpha$) and is parameterized by a center frequency (f). The method also includes transmitting at least one blind source separated signal from the plurality of BSS modules to a PDW generation module communicatively coupled to the filtering subsystem. The method further includes generating, using the PDW generation module and based on the at least one blind source separated signal, at least one PDW parameter vector signal containing the frequency data. The method also includes updating, upon generating the at least one PDW parameter vector signal, and based thereupon, at least one of a value of $\alpha$ and a value of f for each filter module of the plurality of filter modules.

In another aspect, a system is provided for processing a plurality of time-varying signals to generate at least one PDW including at least one of frequency data and bandwidth data. The system includes a sensor configured to receive the at least one time-varying signal, and a signal data processor communicatively coupled to the sensor. The signal data processor includes a plurality of BSS modules, each BSS module of the plurality of BSS modules having a filtering subsystem including a plurality of filter modules, where each filter module of the plurality of filter modules has a frequency filter coefficient $\alpha$ and is parameterized by a center frequency f. The signal data processor also includes a PDW generation module communicatively coupled to the filtering subsystem. The plurality of BSS modules are configured to filter signals derived from the plurality of time-varying signals and transmit at least one blind source separated signal to the PDW generation module. The PDW generation module is configured to generate, based on the at least one blind source separated signal, at least one PDW parameter vector signal containing the frequency data to facilitate updating, substantially simultaneously with generating the at least one PDW parameter vector signal, and based thereupon, at least one of a value of $\alpha$ and a value of f for each filter module of the plurality of filter modules.

In yet another aspect, a signal data processor is provided for processing a plurality of time-varying signals to generate at least one PDW including at least one of frequency data and bandwidth data. The signal data processor includes a plurality of BSS modules, each BSS module of the plurality of BSS modules having a filtering subsystem including a plurality of filter modules, where each filter module of the plurality of filter modules has a frequency filter coefficient $\alpha$ and is parameterized by a center frequency f. The signal data processor also includes a PDW generation module communicatively coupled to the filtering subsystem. The plurality of BSS modules are configured to filter signals derived from the plurality of time-varying signals and transmit at least one blind source separated signal to the PDW generation module. The PDW generation module is configured to generate, based on the at least one blind source separated signal, at least one PDW parameter vector signal containing the frequency data to facilitate updating, substantially simultaneously with generating the at least one PDW parameter vector signal, and based thereupon, at least one of a value of $\alpha$ and a value of f for each filter module of the plurality of filter modules.

BRIEF DESCRIPTION OF THE DRAWINGS

These and other features, aspects, and advantages of the present disclosure will become better understood when the following detailed description is read with reference to the accompanying drawings in which like characters represent like parts throughout the drawings, wherein.

Figure 1:
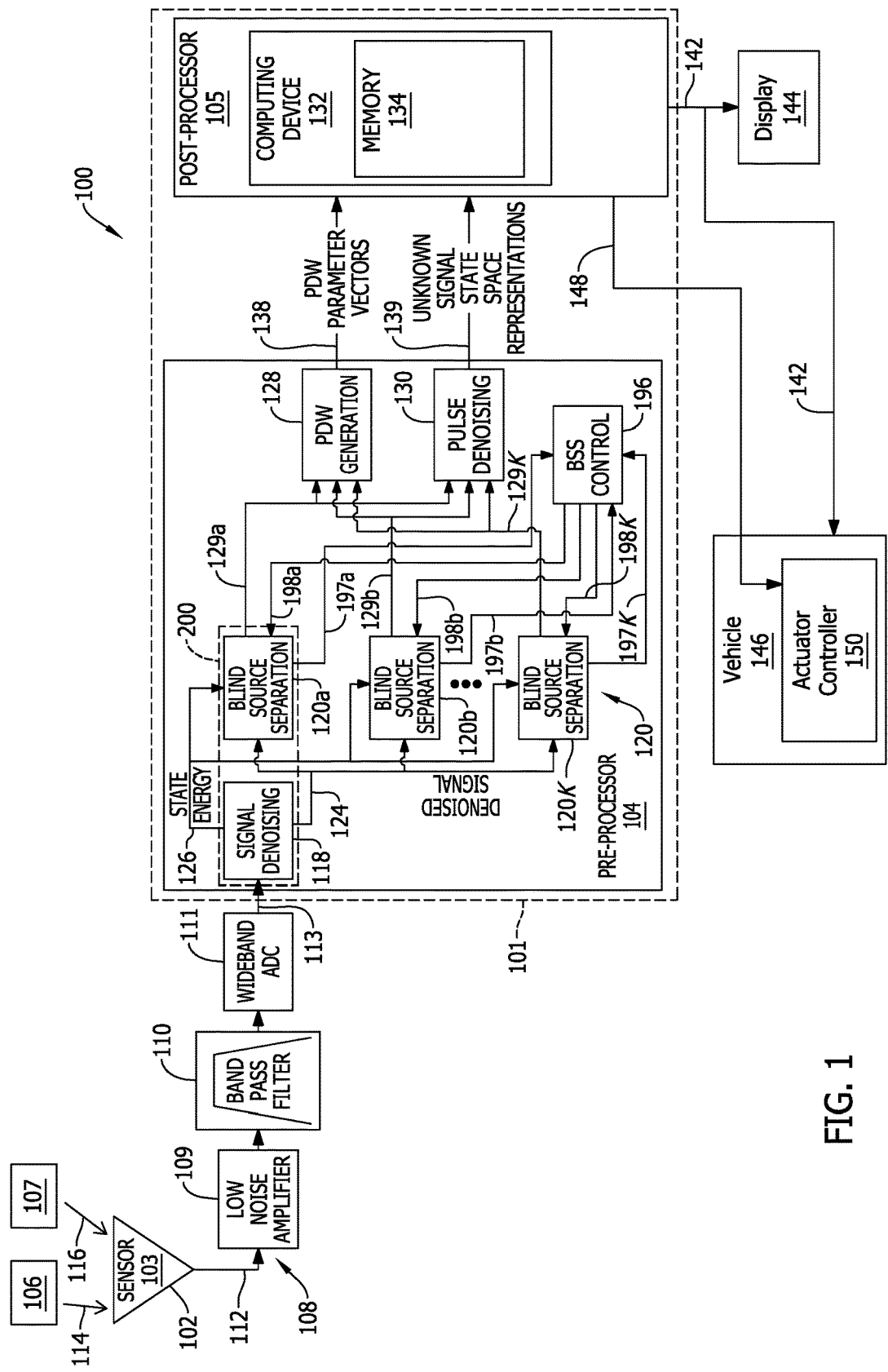
FIG. 1 is a schematic diagram of an exemplary signal processing system for generating pulse descriptor words (PDWs) using blind source separation (BSS).

Unless otherwise indicated, the drawings provided herein are meant to illustrate features of implementations of this disclosure. These features are believed to be applicable in a wide variety of systems comprising one or more implementations of this disclosure. As such, the drawings are not meant to include all conventional features known by those of ordinary skill in the art to be required for the practice of the implementations disclosed herein.

DETAILED DESCRIPTION

In the following specification and the claims, reference will be made to a number of terms, which shall be defined to have the following meanings.

The singular forms "a", "an", and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately", and "substantially", are not to be limited to the precise value specified. In at least some instances, the approximating language may correspond to the precision of an instrument for measuring the value. Here and throughout the specification and claims, range limitations may be combined and/or interchanged, and such ranges are identified and include all the sub-ranges contained therein unless context or language indicates otherwise.

As used herein, the terms "processor" and "computer" and related terms, e.g., "processing device", "computing device", and "controller" are not limited to just those integrated circuits referred to in the art as a computer, but broadly refers to a microcontroller, a microcomputer, a programmable logic controller (PLC), an application specific integrated circuit (ASIC), and other programmable circuits, and these terms are used interchangeably herein. In the implementations described herein, memory may include, but is not limited to, a computer-readable medium, such as a random access memory (RAM), and a computer-readable non-volatile medium, such as flash memory. Alternatively, a floppy disk, a compact disc-read only memory (CD-ROM), a magneto-optical disk (MOD), and/or a digital versatile disc (DVD) may also be used. Also, in the implementations described herein, additional input channels may be, but are not limited to, computer peripherals associated with an operator interface such as a mouse and a keyboard. Alternatively, other computer peripherals may also be used that may include, for example, but not be limited to, a scanner. Furthermore, in the exemplary implementation, additional output channels may include, but not be limited to, an operator interface monitor.

Furthermore, as used herein, the term "real-time" refers to at least one of the time of occurrence of the associated events, the time of measurement and collection of predetermined data, the time to process the data, and the time of a system response to the events and the environment. In the implementations described herein, these activities and events occur substantially instantaneously.

The systems and methods described herein are directed to a signal processing system for generating pulse descriptor words (PDWs). The signal processing system detects a plurality of mixed signals (e.g., radar signals) using a sensor. A signal data processor communicatively coupled to the sensor uses blind source separation (BSS) and other signal processing techniques to separate and identify one or more signals of interest from the plurality of mixed signals. Signal processing techniques described herein include at least two filter modules having distinct filter coefficients and parameterized by at least one of frequency and bandwidth. The signal processing system further updates and stores the filter coefficient and parameter of each filter module to enhance accuracy in identification and tracking of signal parameters (e.g., frequency, amplitude, etc.) of each identified signal of interest.

The signal data processor uses BSS for PDW generation. In the systems and methods described herein, BSS enables enhanced accuracy of PDW parameter estimations without relying on fixed bandwidth channels. The implementations described herein also facilitate faster and more efficient PDW generation using less complex processing architectures relative to known fixed bandwidth channel-based systems. The implementations described herein further enable reduction of size, weight, and cost of high performance PDW signal processing systems and methods. The systems and methods for PDW generation using blind source separation described herein also provide continuous high speed generation of high signal quality PDW parameter vectors suitable for improved deinterleaving methods.

FIG. 1 is a schematic diagram of an exemplary signal processing system 100 for generating pulse descriptor words (PDWs) using BSS. Also known as blind signal separation, BSS is used to separate (e.g., filter) one or more source signals of interest from a plurality of mixed signals. In applications including, without limitation, an underdetermined case (e.g., fewer observed signals than signal sources), BSS facilitates separating and identifying pure signals of interest from an arbitrary set of time-varying signals (e.g., radar pulses from one or more signal emitters) without relying on substantial amounts of known information about the signal emitters, signals of interest, or the signal mixing process.

In the exemplary embodiment, signal processing system 100 includes a signal data processor 101 communicatively coupled to an antenna 102. Antenna 102, in the exemplary embodiment, is a wide-area sensor 103. Signal data processor 101 includes a pre-processor 104 and a post-processor 105. Sensor 103 is configured to receive signals from radar signal emitters 106 and 107. Although two radar signal emitters 106 and 107 are shown in FIG. 1, those of skill in the art will appreciate that sensor 103 may receive signals from any number of radar signal emitters 106 and 107.

Sensor 103 is communicatively coupled to pre-processor 104 through a pre-conditioner 108. In the exemplary embodiment, pre-conditioner 108 includes a low noise amplifier 109, a band pass filter 110, and a wideband analog-to-digital converter (ADC) 111. In operation, pre-conditioner 108 is configured to convert a sensor output signal 112 received from sensor 103 into an incoming signal 113 transmitted to pre-processor 104. Each incoming signal 113 is derived from a time-varying signal received at sensor 103. Time-varying signal may include a mix of signals received from radar signal emitters 106 and 107. For example, time-varying signals may include a first radar signal 114 and a second radar signal 116.

In the exemplary embodiment, pre-processor 104 includes one or more signal denoising modules 118, and a plurality of blind source separation (BSS) modules 120. Each BSS module 120 is coupled to a single signal denoising module 118, and represents one BSS channel. A total number of BSS channels in signal processing system 100 is expressed as K. Signal denoising module 118 transmits a denoised signal 124 and a state energy signal 126 to each respective BSS module 120 (e.g., 120a, 120b, ..., 120K) of the plurality of BSS modules 120. State energy signal 126 represents a quantity (e.g., an analog voltage level) that is proportional to an amplitude of incoming signal 113 at particular sampled time points (e.g., states).

In operation, incoming signal 113 is transmitted from pre-conditioner 108 to signal denoising module 118 where incoming signal 113 undergoes signal denoising and is subsequently transmitted as denoised signal 124 to the each BSS module 120. For example, first radar signal 114 is initially received at sensor 103 as a pulse having signal characteristics including, without limitation, a frequency and a bandwidth. In this example, a single pulse of first radar signal 114, after processing by pre-conditioner 108, is then received at signal denoising module 118 as a mixed signal (e.g., the incoming signal 113 represents a signal pulse of the first radar signal 114 and has various characteristics including, without limitation, noise and information other than the desired information of interest). Signal denoising module 118 denoises the mixed incoming signal 113 prior to transmitting denoised signal 124 having a frequency and a bandwidth (or a regular pattern of frequencies and bandwidths) to the BSS modules 120. Methods implemented by signal processing system 100 are performed in substantially real time by the devices and systems described above, and as shown and described below in further detail with reference to FIG. 2.

Further, in the exemplary embodiment, pre-processor 104 includes one or more PDW generation modules 128 coupled to each BSS module 120, and a pulse denoising module 130 coupled to each BSS module 120. PDW generation module 128 generates PDW parameter vector signals 138 based on blind source separated signals 129 received from each BSS module 120. Each PDW parameter vector signal 138 contains data representative of characteristics of interest of one of radar signals 114 and 116 derived from a singular pulse of blind source separated signal 129 (e.g., frequency, bandwidth, time of arrival, time of departure, pulse width, pulse amplitude, pulse repetition interval, and/or angle of arrival (AOA)). Pulse denoising module 130 also generates an unknown signal state space representation signal 139 based on blind source separated signals 129. Unknown signal state space representation signal 139 contains data representative of additional (e.g., non-PDW-type) characteristics of interest of one of radar signals 114 and 116 from which usable spatial information about one of radar signal emitters 106 and 107 is discernable. PDW parameter vector signals 138 and unknown signal state space representation signals 139 are transmitted to post-processor 105. Signal denoising module 118, PDW generation module 128, and pulse denoising module 130 include suitable signal filtering, signal amplification, signal modulation, signal separation, signal conditioning, and/or ADC circuitry implemented using analog and/or digital electronic circuit components. Also, in the exemplary embodiment, each BSS module 120 transmits a respective blind source separated signal 129 (e.g., 129a, 129b, ..., 129K) to PDW generation module 128 and to pulse denoising module 130.

Post-processor 105 includes a computing device 132 that includes a memory 134. As described above, PDW generation module 128 receives blind source separated signals 129 from each respective BSS module 120. PDW generation module 128 then utilizes the blind source separated signals 129 to generate a PDW parameter vector signal 138, which is subsequently transmitted to post-processor 105. PDW parameter vector signal 138 is received by computing device 132 and stored as computer-readable data in memory 134 including, without limitation, as at least one buffered data set. Pulse denoising module 130 is also configured to receive blind source separated signals 129 from each respective BSS module 120. Pulse denoising module 130 is further configured to utilize the blind source separated signals 129 to generate the unknown signal state space representation signal 139, which is subsequently transmitted to post-processor 105. Unknown signal state space representation signal 139 is received by computing device 132 and stored as computer-readable data in memory 134 including, without limitation, as at least one buffered data set. In the exemplary embodiment, computing device 132 fetches buffered data sets from memory 134 for processing using a computer-based method employing an operating system running software executed from instruction set data also stored in memory 134 (e.g., from one or more computer-readable storage media).

Computing device 132 implements a computer-based method (e.g., from software instructions stored in one or more computer-readable storage media including, without limitation, in memory 134) to carry out operations based on data contained in at least one of PDW parameter vector signal 138 and unknown signal state space representation signal 139. Such operations include, without limitation, detecting, processing, quantifying, storing, and displaying (e.g., in human readable data form) various characteristics of at least one radar signal (e.g., signals 114 and 116) represented as data in at least one of PDW parameter vector signal 138 and unknown signal state space representation signal 139. For example, PDW parameter vector signal 138 generated by PDW generation module 128 contains a plurality of PDW vector data blocks structured in a vector form, where each PDW vector data block contains one parameter of first radar signal 114. Parameters (e.g., representative of at least one characteristic of first radar signal 114) include, without limitation, frequency, bandwidth, time of arrival, time of departure, pulse width, pulse amplitude, pulse repetition interval, and/or AOA. Computing device 132 reads PDW parameter vector signal 138 and carries out at least one of the aforementioned operations on at least one PDW vector data block of the plurality of PDW vector data blocks. Also, in the exemplary embodiment, computing device 132 reads and separates (e.g., deinterleaves) PDW parameter vector signal 138 into its constituent PDW vector data blocks, and stores fewer PDW vector data blocks in memory 134 than the total number of PDW vector data blocks contained in PDW parameter vector signal 138. Deinterleaving of PDW parameter vector signal 138 enables determining characteristics of interest of radar signals 114 and/or 116 by computing device 132 to, for example, and without limitation, accurately determine and track spatial information for radar signal emitters 106 and/or 107. In other implementations, computing device 132 reads and separates all PDW vector data blocks from one another and stores all data contained therein in memory 134. Computing device 132 performs the aforementioned operations substantially simultaneously (e.g., in real time) upon receipt of radar signals 114 and 116 by sensor 103.

Resultant data from operations performed by computing device 132 are stored in memory 134. Further, in the exemplary embodiment, computing device 132 causes post-processor 105 to transmit a data output signal 142 to a human machine interface (HMI) to facilitate at least one of an interaction, a modification, a visualization, at least one further operation, and a viewable recording of information about radar signals 114 and 116 by a user of signal processing system 100. HMI is, for example, a display 144 which receives data output signal 142 from post-processor 105. In one example, characteristics (e.g., location characteristics such as grid coordinates in a physical spatial domain) representing a physical location of radar signal emitters 106 and 107, as determined by signal processing system 100, are displayed on display 144, and are updated in substantially in real time. Data output signal 142 is also transmitted from post-processor 105 to at least one device and/or system (e.g., a vehicle 146) associated with signal processing system 100. Further, computing device 132 enables post-processor 105 to transmit, in substantially real time, an actuator control signal 148 to an actuator controller 150 included within vehicle 146 to facilitate controlling vehicle 146. For example, vehicle 146 may be a remotely and/or autonomously operated land vehicle and/or an unmanned aerial vehicle (UAV).

In one mode of operation, at least one of frequency and bandwidth information contained in respective PDW parameter vector signals 138 is displayed on display 144 along with locations of respective radar signal emitters 106 and 107 to facilitate accurate tracking of locations and association with particular radar signal emitters 106 and 107. In cases where at least one radar signal emitter 106 and 107 is mobile, display 144 is automatically updated in substantially real-time to show the location information of at least one respective mobile radar signal emitter 106 and 107. Further, computing device 132 also determines at least one of a velocity, an acceleration, a trajectory, and a track (e.g., including present and prior locations) of the at least one respective mobile radar signal emitter 106 and 107. In another mode of operation, characteristics determined by signal data processor 101 also trigger a variety of substantially real time physical actions in physical devices and systems in communication with signal processing system 100. For example, characteristics of radar signal emitters 106 and 107, including frequency and bandwidth determined by signal processing system 100, are transmitted in substantially real-time as data to actuator controller 150 in vehicle 146 (e.g., to control rudders and flaps of a UAV). If radar signal emitters 106 and 107 are unauthorized (e.g., hostile, previously undetected, etc.) radar signal emitters determined to be a threat, actuator controller 150 maneuvers vehicle 146 to avoid an area of operation of signal emitters 106 and 107 or engages signal emitters 106 and 107. As a further example, characteristics of radar signal emitters 106 and 107 determined by signal data processing methods described herein are transmitted in substantially real time in a control signal to at least one of an electronic support measure (ESM) device and an electronic warfare (EW) system associated with signal processing system 100 to direct, for example, a radar jamming signal at radar signal emitters 106 and 107 operating in the surveillable environment of sensor 103 without authorization.

In operation, each BSS module 120 of the plurality of BSS modules 120 in signal processing system 100 implements filtering methods with dynamic updating to enable generating high quality PDWs containing at least one of frequency, center frequency, bandwidth, pulse time, and pulse width information. BSS modules 120 may have a pipelined and parallelized architecture in some embodiments. Such improved accuracy and resolution of PDWs to track, for example, frequency and bandwidth of radar signals of interest facilitates identifying, determining, and/or analyzing radar signal emitters 106 and 107 from which associated radar signals are emitted. For example, information including, without limitation, information derived from PDWs from radar signal emitters 106 and 107 is displayed on display 144 after being transmitted thereto by post-processor 105 as data output signal 142, as described above. This improved information enables signal processing system 100 to distinguish first radar signal emitter 106 from second radar signal emitter 107. Also, for example, different radar signal emitters (e.g., first radar signal emitter 106 and second radar signal emitter 107) in a surveilled environment of sensor 103 are plotted at respective locations (e.g., grid coordinates) on display 144 (e.g., as a map).

Also, in operation, the plurality of BSS modules 120 separate a plurality of denoised signals 124. As further shown and described below with reference to FIGS. 2 and 3, each BSS module 120 contains a plurality of tunable filters, where each filter operates based on filter parameters including, without limitation, a center frequency and a bandwidth. Further, in the exemplary embodiment, pre-processor 104 includes a BSS control module 196, which facilitates controlling each respective BSS module 120 of the plurality of BSS modules 120. BSS control module 196 receives respective BSS data signals 197 (e.g., 197a, 197b, . . . , 197K) containing BSS-related information including, without limitation, frequency, bandwidth, and state, from each BSS module 120 of the plurality of BSS modules 120. Based on the BSS-related information contained in BSS data signals 197, BSS control module 196 also generates and transmits respective BSS control signals 198 (e.g., 198a, 198b, . . . , 198K) back to each respective BSS module 120 to control, for example and without limitation, a timing of receipt of denoised signal 124 and transmission of respective blind source separated signals 129 to at least one of PDW generation module 128 and pulse denoising module 130. Information contained in BSS data signals 197 and BSS control signals 198 is used by BSS control module 196 to facilitate implementation of a feedback control loop.

Figure 2:
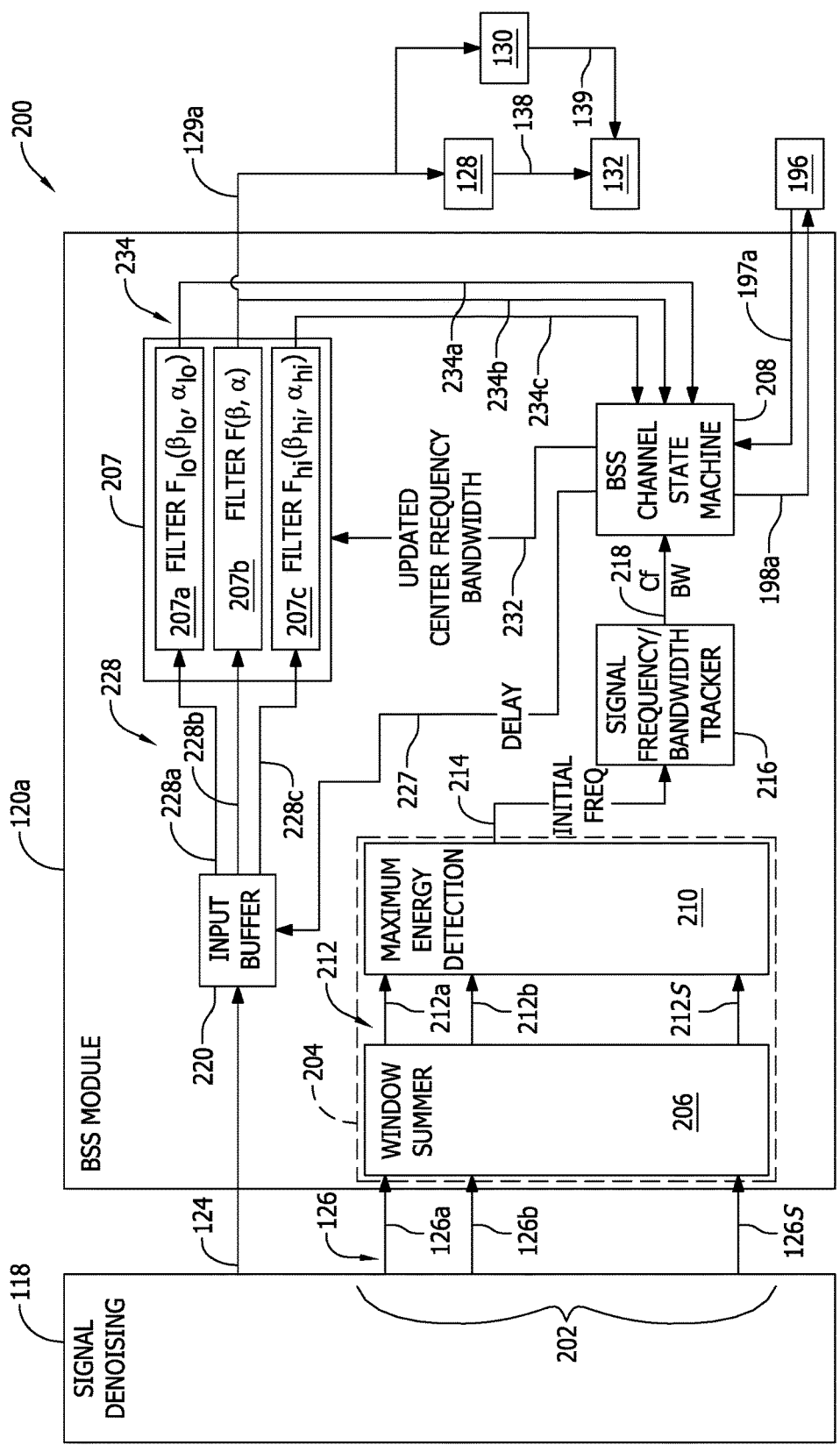
FIG. 2 is a schematic diagram of an exemplary BSS channel that forms a portion of the signal processing system shown in FIG. 1.

FIG. 2 is a schematic diagram of an exemplary BSS channel 200 (e.g., BSS module 120a receiving denoised signal 124 from signal denoising module 118) that forms a portion of the signal processing system 100 shown in FIG. 1. As described above, signal denoising module 118 transmits denoised signal 124 and state energy signal 126. Also, in the exemplary embodiment, state energy signal 126 is embodied in a plurality of state energy signals 126. Each state energy signal 126 of the plurality of state energy signals 126 contains information that is representative of the state (e.g., the analog voltage level that is proportional to the amplitude of incoming signal 113 at particular sampled time points) of a respective state output 202 of signal denoising module 118. The plurality of state energy signals 126 are received by a state energy analysis subsystem 204. State energy analysis subsystem 204 determines a center frequency (e.g., $f_0$) of respective state energy signals 126 of S signals (e.g., 126a, 126b, . . . , 126S) corresponding to S filter states of a filtering subsystem 207. State energy analysis subsystem 204 includes a window summer module 206 configured to determine a total energy within a set of S windows of length $N_e$ (e.g., one for each state of a BSS channel state machine module 208 of BSS module 120a). BSS channel state machine module 208 coordinates a timing of filtering of denoised signal 124 by filtering subsystem 207. State energy analysis subsystem 204 also includes a maximum energy detection module 210 coupled to window summer module 206. Maximum energy detection module 210 is configured to receive S summed window signals 212 (e.g., 212a, 212b, . . . , 212S) and determine a maximum energy of each summed window signal 212 of the S summed window signals 212. Maximum energy detection module 210 is further configured to determine and transmit an initial frequency signal 214 to a signal frequency and bandwidth tracker module 216 coupled to maximum energy detection module 210.

In an exemplary embodiment, initial frequency signal 214 is representative of the $f_0$ of the maximum energy of the respective state energy signal 126 corresponding to the associated state of BSS channel 200. Signal frequency and bandwidth tracker module 216 uses initial frequency signal 214 to determine a center frequency ("Cf") and a bandwidth ("BW") of the respective summed window signal 212 corresponding to the maximum energy state of BSS channel 200. Signal frequency and bandwidth tracker module 216 further outputs a Cf and BW signal 218 to BSS channel state machine module 208. BSS channel state machine module 208 is coupled to filtering subsystem 207, signal frequency and bandwidth tracker module 216, an input buffer module 220, and computing device 132. Substantially simultaneously with receipt of Cf and BW signal 218 by BSS channel state machine module 208 from signal frequency and bandwidth tracker module 216, input buffer module 220 delays filtering of denoised signal 124 by filtering subsystem 207 to enable BSS channel state machine 208 to update Cf and BW filter parameters of filtering subsystem 207 (as further described below).

In the exemplary embodiment, filtering subsystem 207 is a tunable filter bank including a plurality of filter modules including, for example, and without limitation, a low filter ("$F_{lo}$") module 207a, a main filter ("F") module 207b, and a high filter ("$F_{hi}$") module 207c. In other implementations (e.g., as shown and described below with reference to FIG. 5), filtering subsystem 207 includes greater than or less than three filter modules. Input buffer module 220 is coupled to and between filtering subsystem 207 and signal denoising module 118, and is configured to transmit a plurality of filter input signals 228 (e.g., 228a, 228b, and 228c) to respective filter modules (e.g., 207a, 207b, and 207c) in filtering subsystem 207. Input buffer module 220 is further configured to receive a delay signal 227 transmitted from a first output of BSS channel state machine module 208. Delay signal 227 dictates a timing of outputting filter input signal 228 to filtering subsystem 207. From a second output, BSS channel state machine module 208 transmits a center frequency and bandwidth update signal 232 to filtering subsystem 207. Center frequency and bandwidth update signal 232 enables continuous updating of Cf and BW operational parameters and associated filter coefficients α ("alpha") and β ("beta"), respectively, of each filter module (e.g., 207a, 207b, and 207c) in filtering subsystem 207. Center frequency and bandwidth update signal 232 thus facilitates accurate tracking of denoised signal 124 frequency and bandwidth to yield a continuous and undistorted blind source separated signal 129a output from BSS module 120a and BSS channel 200.

In the exemplary embodiment, filtering subsystem 207 uses digital and/or analog electronic circuitry including, without limitation, circuits instantiated in at least one of a field-programmable gate array (FPGA) and an application-specific integrated circuit (ASIC). Also, in the exemplary embodiment, at least a portion of the methods implemented in BSS channel 200 are instantiated via software on at least one of a general purpose processor (e.g., computing device 132) and a digital signal processor (DSP). Further, in the exemplary embodiment, operational parameters of each filter module (e.g., 207a, 207b, and 207c) in filtering subsystem 207 are stored in memory 134, and are updated substantially simultaneously (e.g., in real time) with transmission of center frequency and bandwidth update signal 232 by BSS channel state machine module 208.

In the exemplary embodiment, filter module $F_{lo}$ 207a, filter module F 207b, and filter module $F_{hi}$ 207c receive respective filter input signals (e.g., 228a, 228b, and 228c) from input buffer module 220, and are each further coupled to BSS channel state machine module 208. Filtering subsystem 207 is further configured to transmit a plurality of signal energy signals 234, where filter modules $F_{lo}$ 207a, F 207b, and $F_{hi}$ 207c each transmit respective signal energy signals (e.g., 234a, 234b, and 234c, respectively) to BSS channel state machine module 208. Further, in the exemplary embodiment, filter module F 207b also transmits signal energy signal 234b as the respective blind source separated signal 129a transmitted from BSS module 120a to PDW generation module 128 and to pulse denoising module 130 for further processing (e.g., deinterleaving of PDW parameter vector signal 138 by computing device 132, as shown and described above with reference to FIG. 1). Information contained in the plurality of signal energy signals 234 is used by BSS channel state machine module 208 for generating and transmitting center frequency and bandwidth update signal 232 to filtering subsystem 207 (as further shown and described below with reference to FIGS. 3 and 4).

In operation, feedback in BSS channel 200 is used to determine where (e.g., at what value or values) to place the Cf and BW of each filter module (e.g., filter modules $F_{lo}$ 207a, F 207b, and $F_{hi}$ 207c) of filtering subsystem 207 over all time. The feedback includes acquiring energy measurements resulting from existing filter settings (e.g., from signal energy signals 234a, 234b, and 234c), and continuously and adaptively updating respective filter parameters Cf and BW and filter coefficients α and β, while maintaining as complete a coverage in time and frequency as possible. Subsequent pulses of radar signals are filtered by filtering subsystem 207 with filter modules $F_{lo}$ 207a, F 207b, and $F_{hi}$ 207c having respective filter parameters and coefficients tuned to enable filtering subsystem 207 to multitask in a very efficient manner (e.g., under control, at least in part, of BSS control module 196, as described above with reference to FIG. 1).

Also, in operation, signal frequency and bandwidth tracker module 216 includes a tracking algorithm to track a value of the initial frequency signal 214. Specifically, the Cf of initial frequency signal 214 changes at any rate up to a maximum predetermined rate set by the tracking algorithm (e.g., determined by at least one of computing device 132, BSS channel state machine module 208, and BSS control module 196). A track window of the tracking algorithm is short enough to support a chirp rate, but long enough to handle the signal noise level. In particular, the tracking algorithm is robustly implemented by BSS channel 200 including, without limitation, in conjunction with computing device 132, as a function of all of the following: parameter and/or coefficient settings of the plurality of filter modules (e.g., 207a, 207b, and 207c), noise levels, signal frequency change characteristics, amplitude differences, and ability to pull-in signals within range required by signal denoising module 118. For example, and without limitation, where signal denoising module 118 has twenty states (e.g., S=20) with a 1 GHz bandwidth, BSS channel 200 tracks radar signals with a frequency offset from an initial frequency (e.g., pull-in range) up to ±25 MHz (e.g., 0.025 GHz).

In the exemplary embodiment, each filter module (e.g., 207a, 207b, and 207c) in filtering subsystem 207 is an infinite impulse response (IIR) filter. Also, in the exemplary embodiment, BSS channel 200 processes radar signals rather than communications signals and, therefore, the effects of a non-constant group delay caused by using IIR filters is less important than with communications signals. IIR filters adequately meet the signal quality required for post-filtering PDW deinterleaving by post-processor 105.

Filter module F 207b is used as the primary filter for separating filter input signal 228b derived from denoised signal 124. Filtering of filter input signals 228a and 228c by filter modules $F_{lo}$ 207a and $F_{hi}$ 207c, respectively, is used in the tracking process to keep filter module F 207b relatively accurate in determining both frequency and bandwidth. Also, in the exemplary embodiment, filter modules $F_{lo}$ 207a and $F_{hi}$ 207c are offset by fixed amounts in frequency and bandwidth and, as with filter module F 207b, are continuously monitored to facilitate appropriate and timely tuning of Cf and BW.

Each of the filter modules $F_{lo}$ 207a, F 207b, and $F_{hi}$ 207c are parameterized by two values (e.g., Cf and BW). In an alternative implementation, not shown, filtering subsystem 207 includes two filter modules (e.g., filter modules F 207b and $F_{hi}$ 207c), rather than three filter modules, BSS channel 200 has a fixed BW, and a simplified tracking process tracks only frequency. In this simplified case, Cf and BW of filter module F 207b are referred to as f and w, respectively, such that:

$$\text{center frequency}(F_{hi}) = f + \Delta f \quad \text{Equation 1}$$

$$\text{bandwidth}(F_{hi}) = w \quad \text{Equation 2}$$

For the exemplary embodiment, where filtering subsystem 207 includes three filter modules (e.g., filter modules $F_{lo}$ 207a, F 207b, and $F_{hi}$ 207c), Cf and BW of filter module F 207b are defined according to Equations 1 and 2, and Cf and BW (e.g., f and w, respectively) of filter modules $F_{lo}$ 207a and $F_{hi}$ 207c are defined as follows:

$$\text{center frequency}(F_{lo}) = f - \Delta f \quad \text{Equation 3}$$

$$\text{bandwidth}(F_{lo}) = w - \Delta w \quad \text{Equation 4}$$

$$\text{center frequency}(F_{hi}) = f + 2\Delta f \quad \text{Equation 5}$$

$$\text{bandwidth}(F_{hi}) = w + 2\Delta w \quad \text{Equation 6}$$

Also, in operation, respective signal energy signals 234 (e.g., 234a, 234b, and 234c) output by respective filter modules (e.g., filter modules $F_{lo}$ 207a, F 207b, and $F_{hi}$ 207c) in filtering subsystem 207 have their output energies determined by BSS channel state machine module 208 including, without limitation, in conjunction with methods performed using at least one of computing device 132 and BSS control module 196. For real-valued signal energy signals 234, the output energies are determined through squaring, and for complex-valued signal energy signals 234, the output energies are determined by taking the absolute value. For either real-valued or complex-valued signal energy signals 234, determination of the output energies in the case of filtering subsystem 207 having three filter modules (e.g., $F_{lo}$ 207a, F 207b, and $F_{hi}$ 207c) results in a sequence of energy measurement triples (E(n), $E_{lo}(n)$, $E_{hi}(n)$), n=1, 2, ... ), where n represents the state of BSS channel 200, as described above. In the simplified two filter case, determination of the output energies of signal energy signals 234 results in a sequence of energy measurement pairs (E(n), $E_{hi}(n)$), n=1, 2, ... ), and facilitates the following updates to the Cf (e.g., f) parameters of filter modules F 207b and $F_{hi}$ 207c:

$$f \leftarrow f + \alpha_0 * [(E(n) - E_{hi}(n))/(E(n) + E_{hi}(n))] + \alpha_1 \quad \text{Equation 7}$$

In the exemplary embodiment where filtering subsystem 207 includes three filter modules (e.g., $F_{lo}$ 207a, F 207b, and $F_{hi}$ 207c), f and w parameters are updated as follows:

$$f \leftarrow f | \alpha_0 * [(E(n) - E_{lo}(n))/(E(n) + E_{lo}(n))] + \alpha_1 * [(E(n) - E_{hi}(n))/(E(n) + E_{hi}(n))] + \alpha_2 \quad \text{Equation 8}$$

$$w \leftarrow w + \beta_0 * [E(n) - E_{lo}(n)]/[E(n) + E_{lo}(n))] + \beta_1 * [(E(n) - E_{hi}(n))/(E(n) + E_{hi}(n))] + \beta_2 \quad \text{Equation 9}$$

where initial values of coefficient vectors α and β are determined and stored in memory 134 during a pre-training process (e.g., implemented by at least one of computing device 132, BSS channel state machine module 208, and BSS control module 196), and are functions of window size, BW, and signal-to-noise ratio (SNR). Initial values of α and β are determined from at least one of an initial denoised signal 124 and an initial state energy signal 126 received at BSS channels 200.

Referring again to FIG. 2, in operation of the exemplary embodiment, respective filter input signals (e.g., 228a, 228b, and 228c) derived from at denoised signal 124 are provided substantially simultaneously to each filter module (e.g., $F_{lo}$ 207a, F 207b, and $F_{hi}$ 207c) in filtering subsystem 207 of each BSS module 120 of the plurality of BSS modules 120 in signal processing system 100. In BSS channel 200, for example, the resulting blind source separated signal 129a output by filtering subsystem 207 is further vectorized into PDW parameter vector signal 138 by PDW generation module 128 to further facilitate accurate tracking and determination of frequency and/or bandwidth of at least one radar signal. Therefore, BSS channel 200 enables signal processing system 100 to implement high performance real time tracking of a plurality of time-varying radar signals streaming through pre-processor 104.

The aforementioned filtering methods enable signal processing system 100 to generate high quality PDW parameter vector signals 138 that are used for identifying, determining, and analyzing radar signal emitters 106 and 107. For example, PDW parameter vector signals 138 associated with radar signal emitter 106 are displayed on display 144, as described above. Also, for example, improved information about frequencies and/or bandwidths contained in at least two PDW parameter vector signals 138 enable signal processing system 100 to distinguish first radar signal emitter 106 from second radar signal emitter 107. These radar signal emitters 106 and 107 are plotted at respective locations on display 144 (e.g., as a map).

Figure 3:
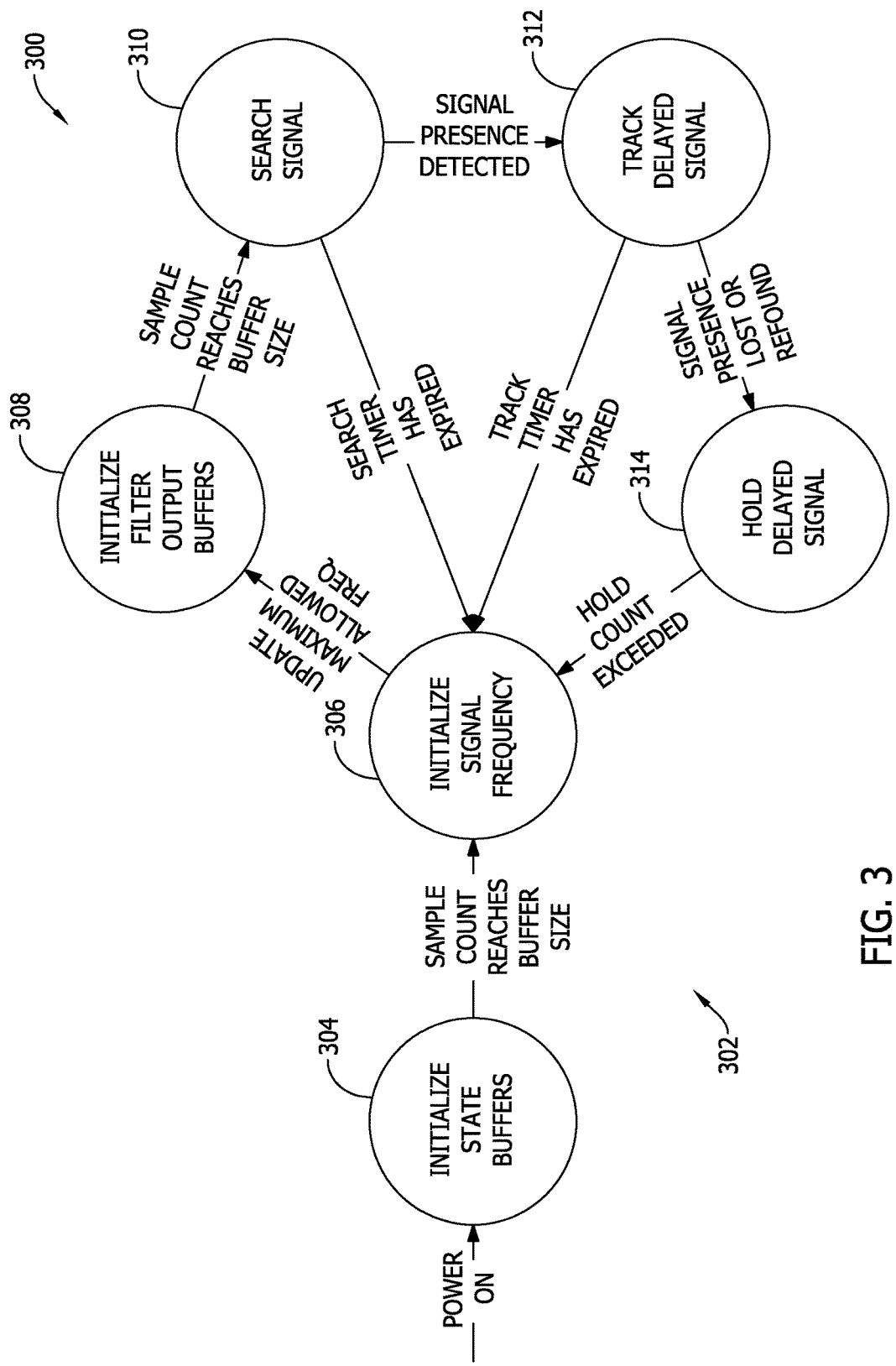
FIG. 3 is a schematic diagram of an exemplary BSS state machine process that may be used with the BSS channel state machine module shown in FIG. 2.

FIG. 3 is a schematic diagram of an exemplary BSS state machine process 300 that may be used with the BSS channel state machine module 208 shown in FIG. 2. In the exemplary implementation, BSS state machine process 300 includes a plurality of states 302. The plurality of states 302 includes a first state 304, a second state 306, a third state 308, a fourth state 310, a fifth state 312, and a sixth state 314. Also, in the exemplary embodiment, BSS state machine process 300 (including, without limitation, performed in conjunction with at least one of computing device 132 and BSS control module 196) moves through the plurality of states 302 as follows: first state 304→second state 306→third state 308→fourth state 310→fifth state 312→sixth state 314→second state 306. First state 304 includes initialization of state energy buffers, and it begins upon a user powering on signal processing system 100. In order to compare energies of different states, a continuous sum is determined over a time window of length $N_e$. Thus, first state 304 enables the initial sum to be determined upon system power-up and is never reentered.

Also, in the exemplary implementation, second state 306 includes initialization of the signal frequency. Once each state's summed energy is computed, a maximum value thereof is determined in S clocks and an initial tracking frequency $f_0$ is determined using a linear relationship between the states and their corresponding frequencies. Second state 306 also includes initiation of the tracking frequency that is input to the tunable tracking filters of filtering subsystem 207 (shown in FIG. 2), offset appropriately. Further, in the exemplary implementation, third state 308 includes initialization of filter output buffers. In order to compare filter output energies from all the tracking filters of filtering subsystem 207 over a time window of length $N_f$ with the initial frequency setting, third state 308 waits $N_f$ sample times so that the summed energies accurately reflect the effects of the frequency that is set.

Further, in the exemplary implementation, fourth state 310 includes searching the delayed signal. After obtaining accurate filter output energies, the frequency and bandwidth updates are computed correctly. Thus, fourth state 310 also includes initiating the tracking loop. To do so, fourth state 310 further includes switching to a delayed sample from the sample buffer of length $N_s$ and attempts to pull-in the signal until a signal presence indicator is equal to or greater than a pre-determined threshold. If the signal presence indicator is not equal to or greater than the pre-determined threshold, fourth state 310 transitions back to second state 306 after a search counter expires.

Furthermore, in the exemplary implementation, fifth state 312 includes tracking the delayed signal. After the signal is detected, it is continually tracked from the delay sample buffer as long as the signal is present, or until a track timeout occurs. The track timeout facilitates preventing the tracking filter resources in filtering subsystem 207 from being kept busy by long communications signals (e.g., which would prevent those filtering resources from being utilized for more important radar signals). A track timeout event during fifth state 312 causes fifth state 312 to transition back to second state 306. However, if the signal presence indicator is equal to or less than the pre-determined threshold, fifth state 312 transitions to sixth state 314. Moreover, in the exemplary implementation, sixth state 314 includes holding the delayed signal. When the tracked signal is no longer present (e.g., no longer detected by sensor 103), the hold state of sixth state 314 enables preventing the frequency from being updated, and signals BSS state machine process 300 to start a hold timer. If the signal presence indicator is equal to or greater than the pre-determined threshold, sixth state 314 transitions back to tracking the delayed signal (e.g., fifth state 312). Otherwise, the hold timer expires and sixth state 314 transitions back to second state 306.

Figure 4A:
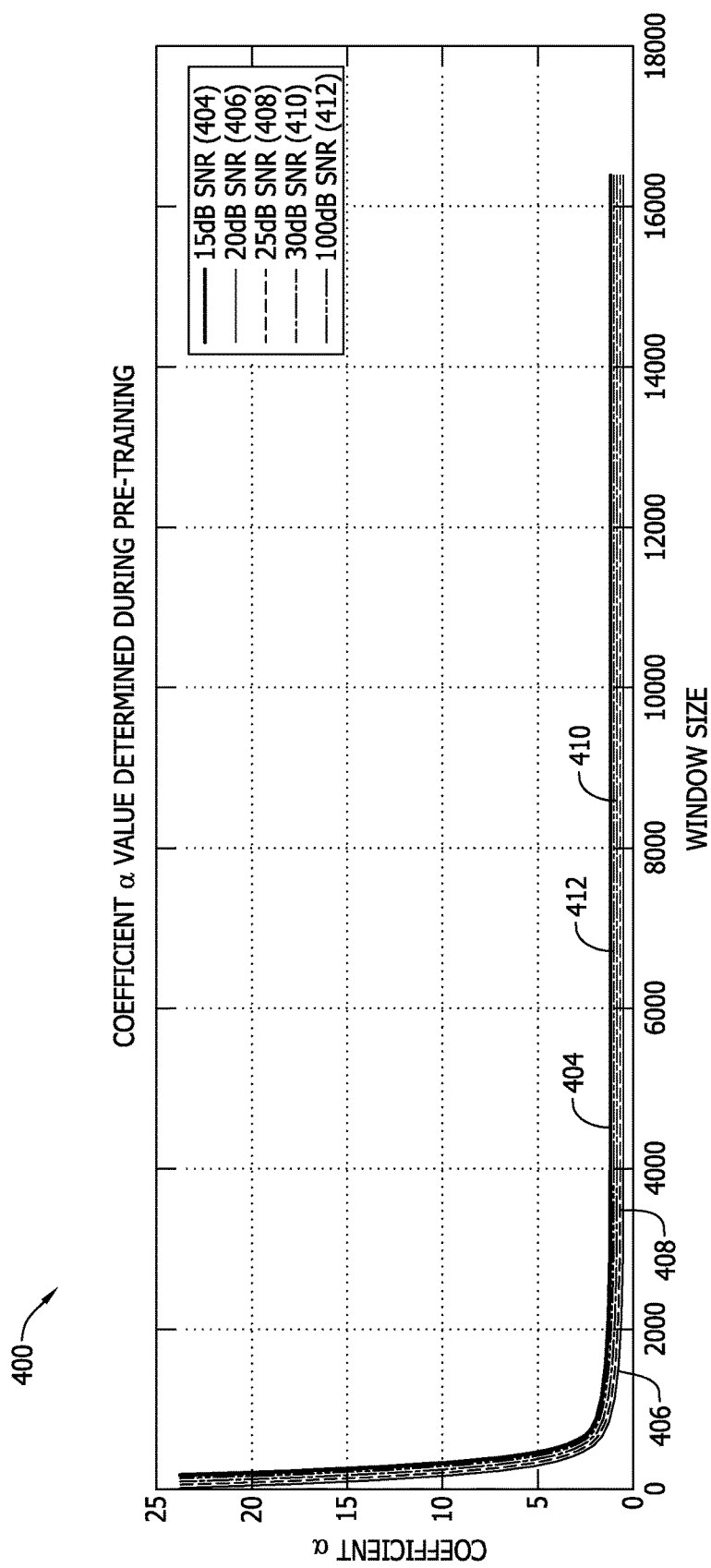
FIG. 4A is a graphical representation of operation of the signal processing system shown in FIG. 1 depicting values for coefficient alpha ($\alpha$) determined during pre-training versus window size with multiple signal-to-noise ratios (SNRs).
Figure 4B:
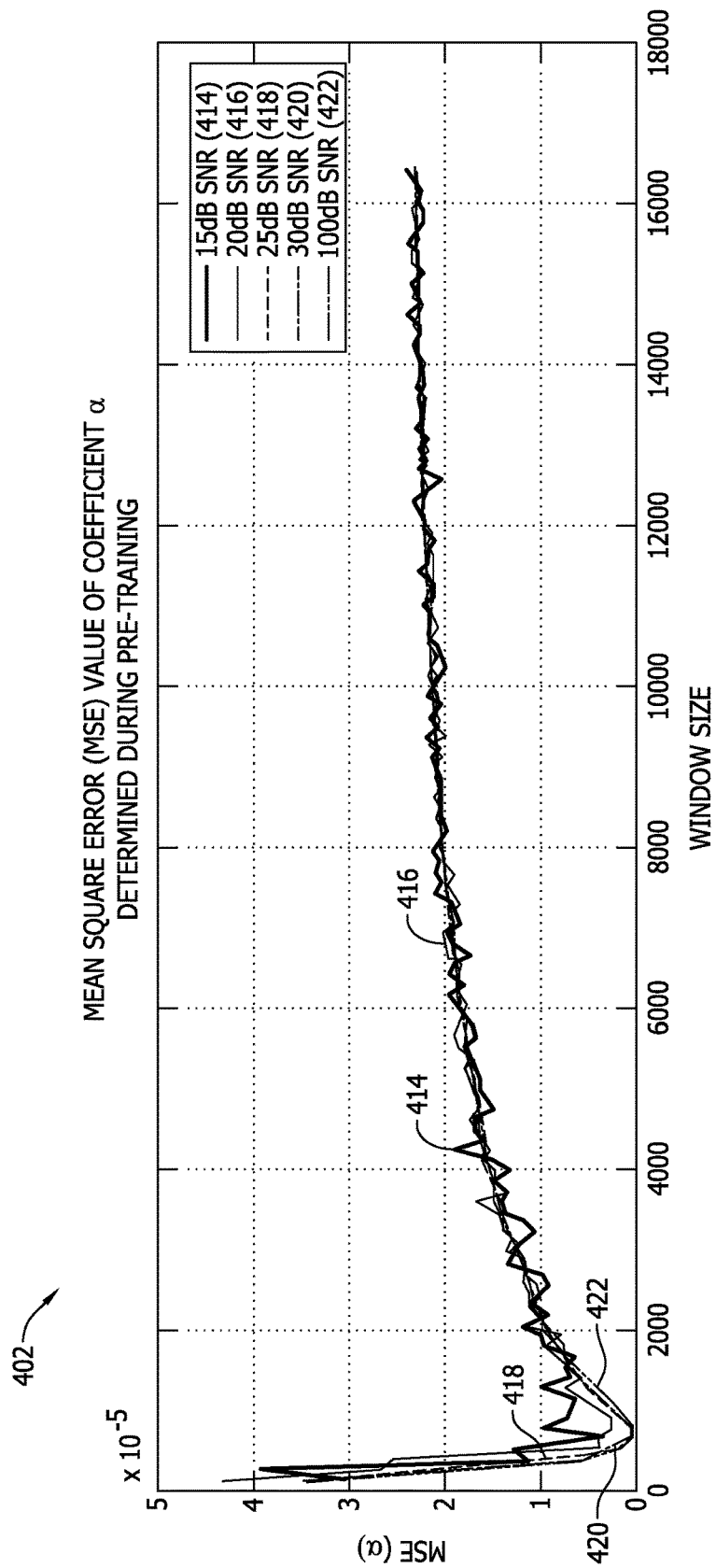
FIG. 4B is a graphical representation of operation of the signal processing system shown in FIG. 1 depicting mean squared error (MSE) results for coefficient $\alpha$ for the graphical representation shown in FIG. 4A versus window size.

FIG. 4A is a graphical representation (e.g., graph 400) of operation of the signal processing system 100 shown in FIG. 1 depicting values for coefficient alpha (α) determined during pre-training versus window size with multiple SNRs. FIG. 4B is a graphical representation (e.g., graph 402) of operation of the signal processing system 100 shown in FIG. 1 depicting mean squared error (MSE) results for coefficient α for graph 400 versus window size. In the exemplary implementation, graph 400 plots results for coefficient α (y-axis) determined at five different SNRs using the systems and methods described above with reference to FIGS. 1-3. Results of α are also plotted in graph 400 over window sizes of 100 to 16400 on the x-axis. Graph 400 includes a first plot 404 of determined α values at an SNR of 15 decibels (dB). Graph 400 also includes a second plot 406 and a third plot 408 of determined α values at SNRs of 20 dB and 25 dB, respectively. Graph 400 further includes a fourth plot 410 and a fifth plot 412 of determined α values at SNRs of 30 dB and 100 dB, respectively. Also, first plot 404, second plot 406, third plot 408, fourth plot 410, and fifth plot 412 are substantially equal in graph 400 and all substantially overlap, indicating that determined values of α are dependent on window size between window sizes values of 100 and approximately 4000. At windows size values between 4000 and 16400, on the other hand, determined α values are independent of window size in graph 400. The aforementioned dependency relationship between determined α values and window sizes also holds for the five above-listed SNRs in first plot 404, second plot 406, third plot 408, fourth plot 410, and fifth plot 412 in graph 400, indicating that the systems and methods shown and described above with reference to FIGS. 1-3 are implementable with substantially similar benefits in operation of the exemplary implementation on hardware and processing architectures having varying SNRs depending on particular applications of signal processing system 100.

Further, in the exemplary implementation, graph 402 plots results for MSE of coefficient α (y-axis) determined at the same five SNRs as in FIG. 4A. Results of MSE of α are also plotted in graph 402 over the same window sizes as in FIG. 4A. Graph 402 includes a sixth plot 414 of determined MSE of α values at an SNR of 15 decibels (dB). Graph 402 also includes a seventh plot 416 and an eighth plot 418 of determined MSE of α values at SNRs of 20 dB and 25 dB, respectively. Graph 402 further includes a ninth plot 420 and a tenth plot 422 of determined MSE of α values at SNRs of 30 dB and 100 dB, respectively. Also, in the exemplary implementation, between window size values of 4000 and 16400 in graph 402, sixth plot 414, seventh plot 416, eighth plot 418, ninth plot 420, and tenth plot 422 are substantially similar, with a greatest variation of approximately $0.3*10^{-5}$ in determined MSE of α values occurring between sixth plot 414 (15 dB SNR) and tenth plot 422 (100 dB SNR) at a window size of approximately 4200. Between window size values of 100 and 4000 in graph 402, the greatest variation of approximately $2.7*10^{-5}$ in determined MSE of α values occurs between sixth plot 414 (15 dB SNR) and tenth plot 422 (100 dB SNR) at a window size of approximately 300. Overall, in graph 402, determined MSE of α values vary with lesser magnitudes as SNR increases. Between window size values of 4000 and 16400, however, MSE of α values exhibit diminishingly small variations across all five SNRs, indicating (as in FIG. 4A) that the systems and methods shown and described above with reference to FIGS. 1-3 are implementable with substantially similar benefits in operation of the exemplary implementation on hardware and processing architectures having varying SNRs depending on particular applications of signal processing system 100.

Figure 5A:
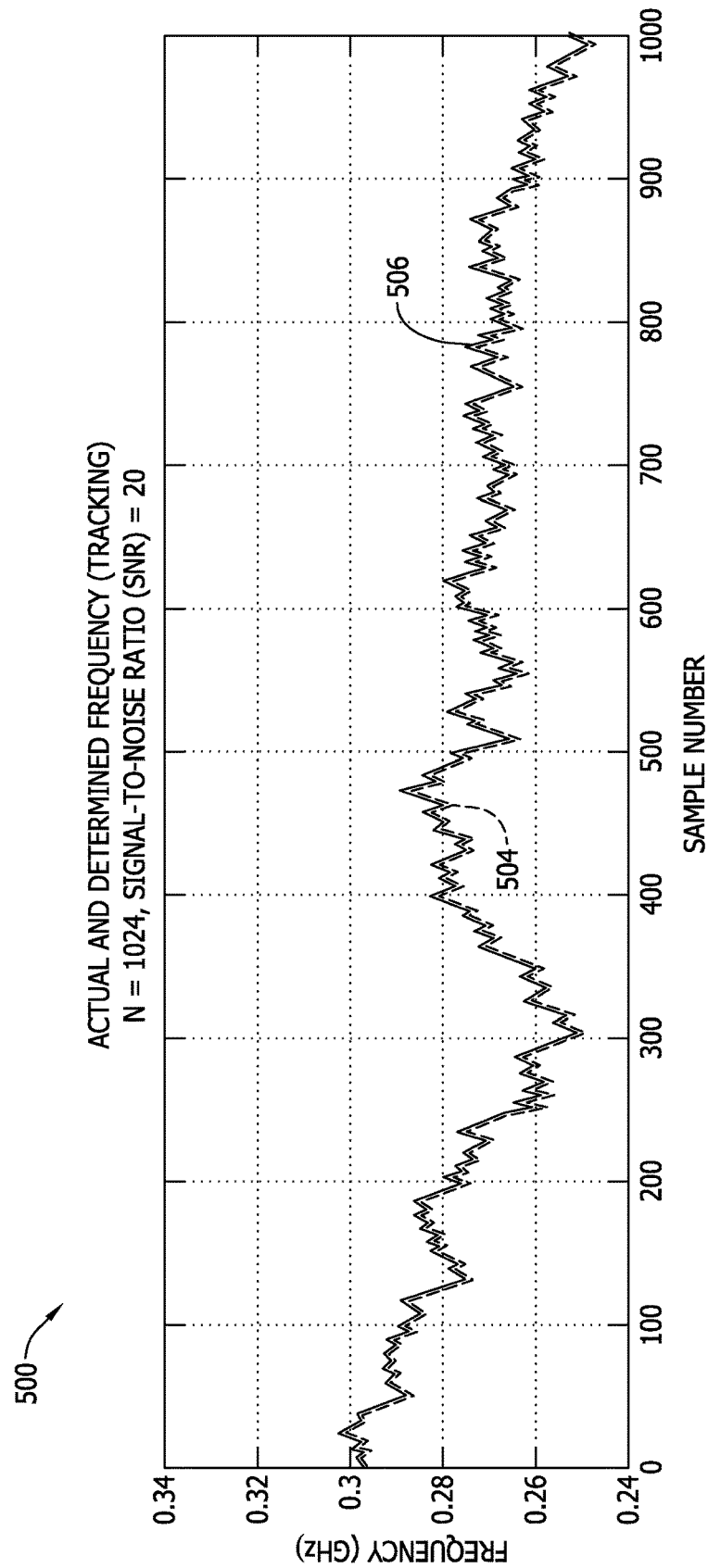
FIG. 5A is a graphical representation of operation of the signal processing system shown in FIG. 1 depicting frequency tracking results versus sample number for an SNR value of 20 dB.
Figure 5B:
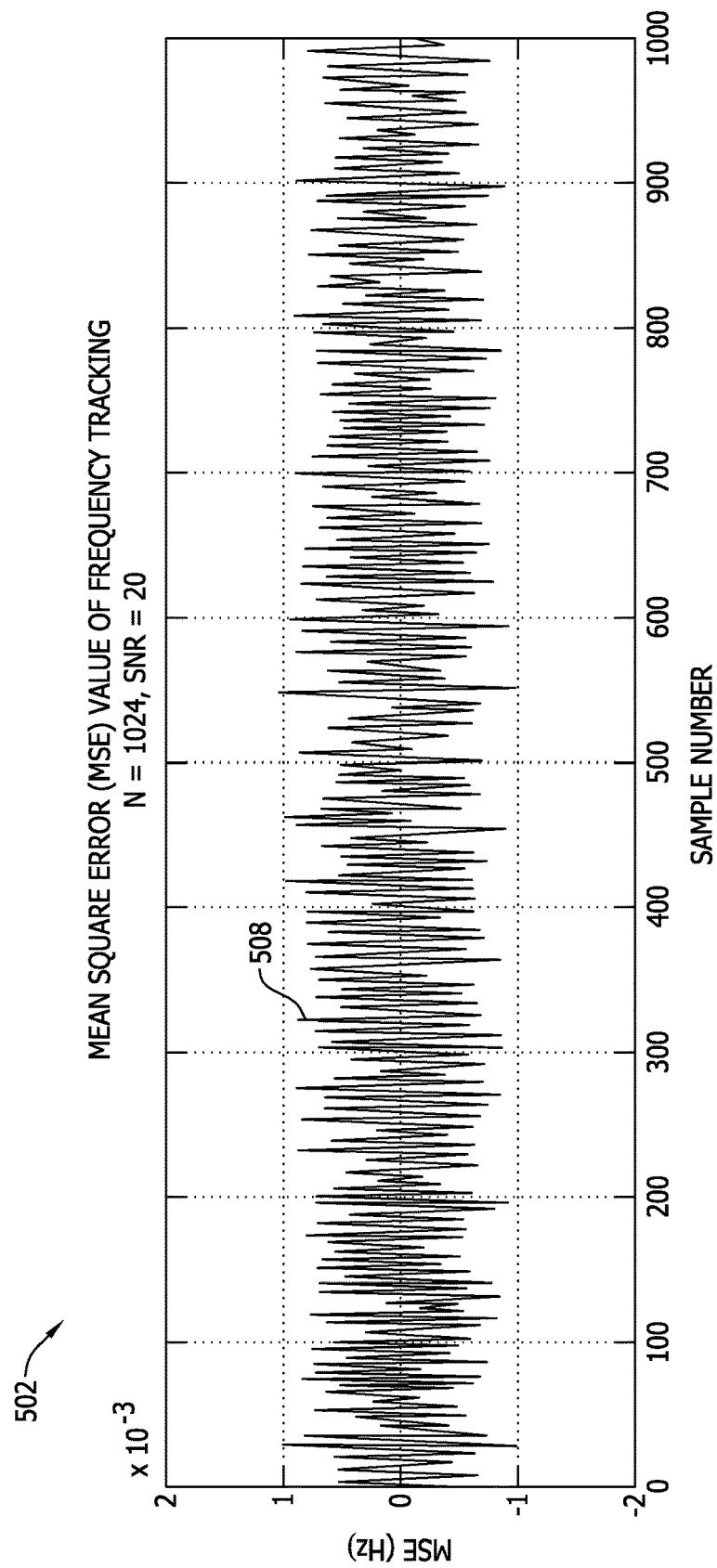
FIG. 5B is a graphical representation of operation of the signal processing system shown in FIG. 1 depicting MSE results for frequency tracking results for the graphical representation shown in FIG. 5A versus sample number.

FIG. 5A is a graphical representation (e.g., graph 500) of operation of the signal processing system 100 shown in FIG. 1 depicting frequency tracking results versus sample number for an SNR value of 20 dB. FIG. 5B is a graphical representation (e.g., graph 502) of operation of the signal processing system 100 shown in FIG. 1 depicting MSE results for frequency tracking results for the graphical representation shown in FIG. 5A versus sample number. Graph 500 includes a first plot 504 of actual frequencies in gigahertz (GHz) on the y-axis (e.g., randomly selected pulses of radar signals of known frequency received and sampled by sensor 103 of signal processing system 100) over sample numbers from 0 (zero) to 1024 on the x-axis. Graph 500 also includes a second plot 506 of frequency (GHz) values determined (e.g., as PDW data blocks contained in deinterleaved PDWs derived from blind source separation and filtering, as shown and described above with reference to FIGS. 1-2) over sample numbers 0 to 1024. Also, first plot 504 and second plot 506 are substantially equal in graph 500, indicating that, at SNR=20 dB, signal processing system 100 efficiently generates PDWs containing highly accurate frequency information derived from blind source separated and filter signals.

Further, graph 502 plots results for MSE for the frequency tracking results over sample numbers 0 to 1024 shown and described above with reference to FIG. 5A. Graph 502 includes a third plot 508 of determined MSE of frequency ($Hz*10^{-3}$) at an SNR of 20 decibels (dB). In graph 502, MSE of frequency values vary by no more than about $1*10^{-3}$ Hz over sample numbers 0 to 1024, and no particular subset of sample numbers exhibits substantially more variation than another particular subset of sample numbers, indicating accurate, precise, and consistent high performance tracking of actual frequencies by signal processing system 100 over a range of about 0.23 GHz to 0.3 GHz.

Figure 6:
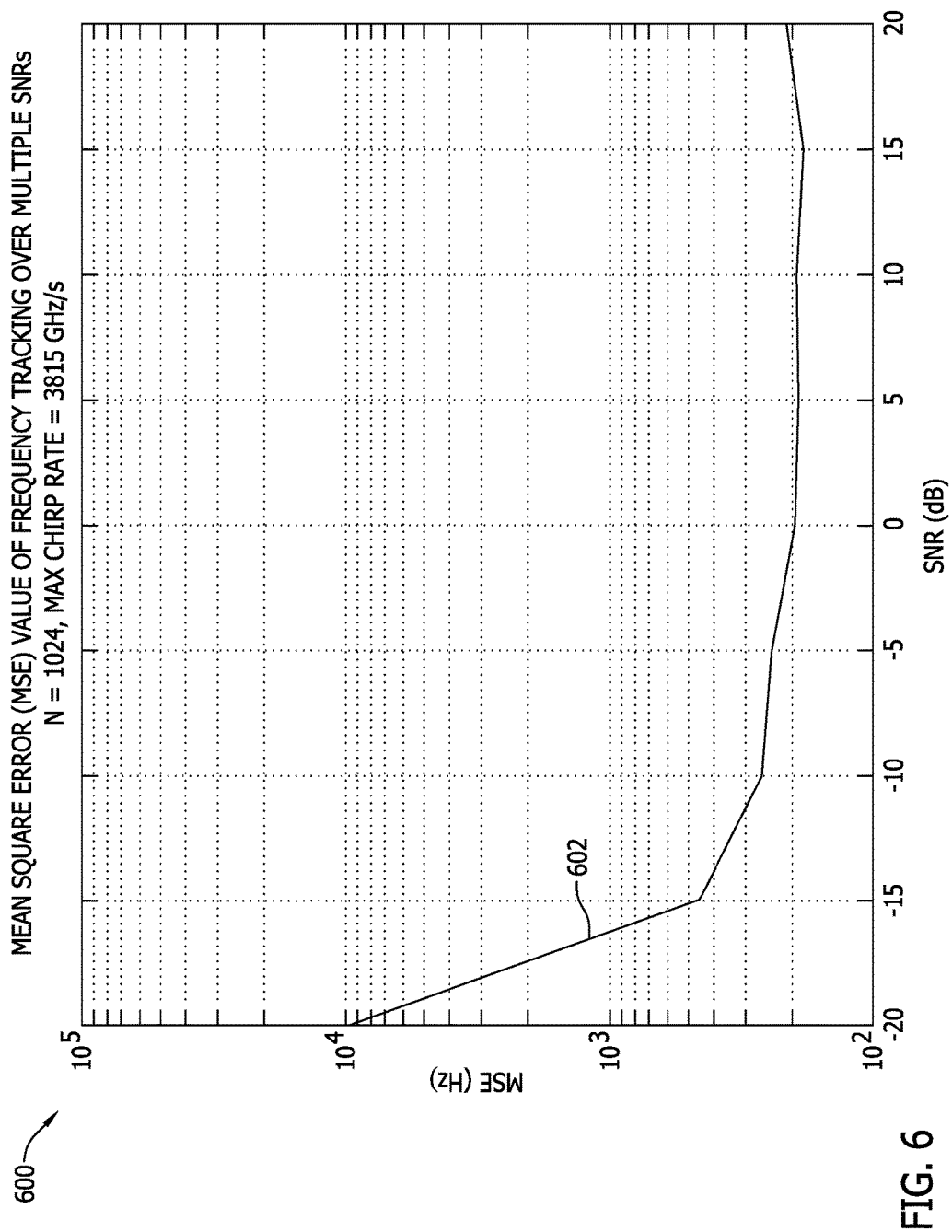
FIG. 6 is a graphical representation of operation of the signal processing system shown in FIG. 1 depicting MSE results for frequency tracking for a range of SNRs.

FIG. 6 is a graphical representation (e.g., graph 600) of operation of the signal processing system 100 shown in FIG. 1 depicting MSE results for frequency tracking for a range of SNRs. Graph 600 includes a plot 602 of determined MSE (y-axis) of frequency in Hertz (Hz) for SNRs (y-axis) ranging from −20 dB to 20 dB (e.g., frequency tracking performance as a function of SNR for signal processing system 100). Operational data of signal processing system 100 plotted in graph 600 was obtained in substantially the same manner as for FIGS. 5A and 5B over sample numbers 0 to 1024 and with a maximum chirp rate of 3815 GHz per second. MSE values in graph 600 decline from a maximum of about $10^4$ Hz at an SNR value of −20 dB to approximately 200 Hz at an SNR of 0 dB, and exhibit substantially the same downward trend in MSE for frequency tracking with increasing SNR values as do MSE of α values as shown and described above with reference to FIG. 4B. For SNR values greater than or equal to −20 dB and less than or equal to 0 dB, frequency tracking MSE values are consistent and substantially constant at approximately 200 Hz, again indicating (as shown and described above with reference to FIGS. 4A and 4B) that the systems and methods shown and described above with reference to FIGS. 1-3 are implementable with substantially similar benefits in operation of the exemplary implementation on hardware and processing architectures having varying SNRs of greater than or equal to 0 and less than or equal to 20 depending on particular applications of signal processing system 100.

Figure 7A:
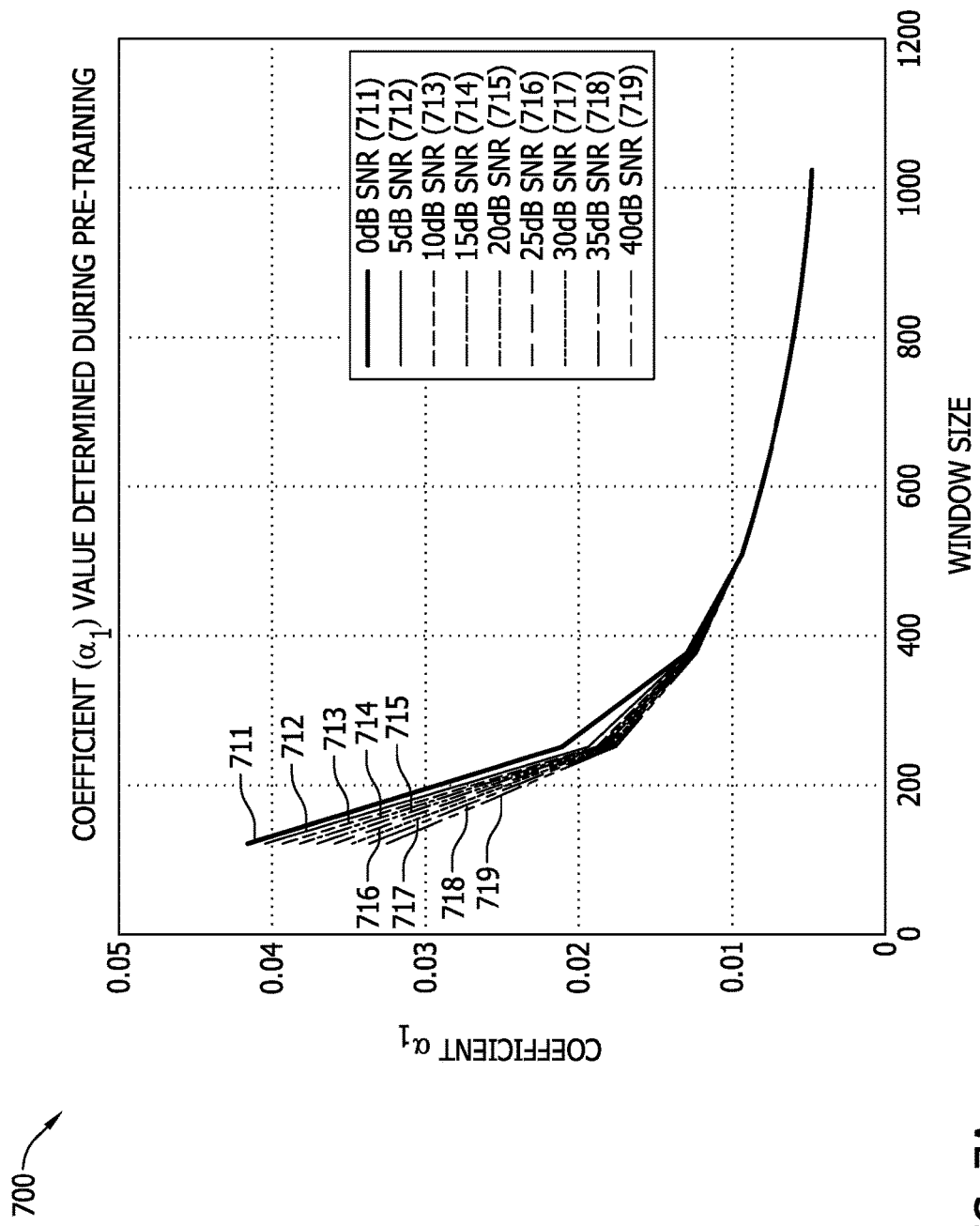
FIG. 7A is a graphical representation of operation of the signal processing system shown in FIG. 1 depicting values for coefficient $\alpha_1$ determined during pre-training versus window size with multiple SNRs.
Figure 7B:
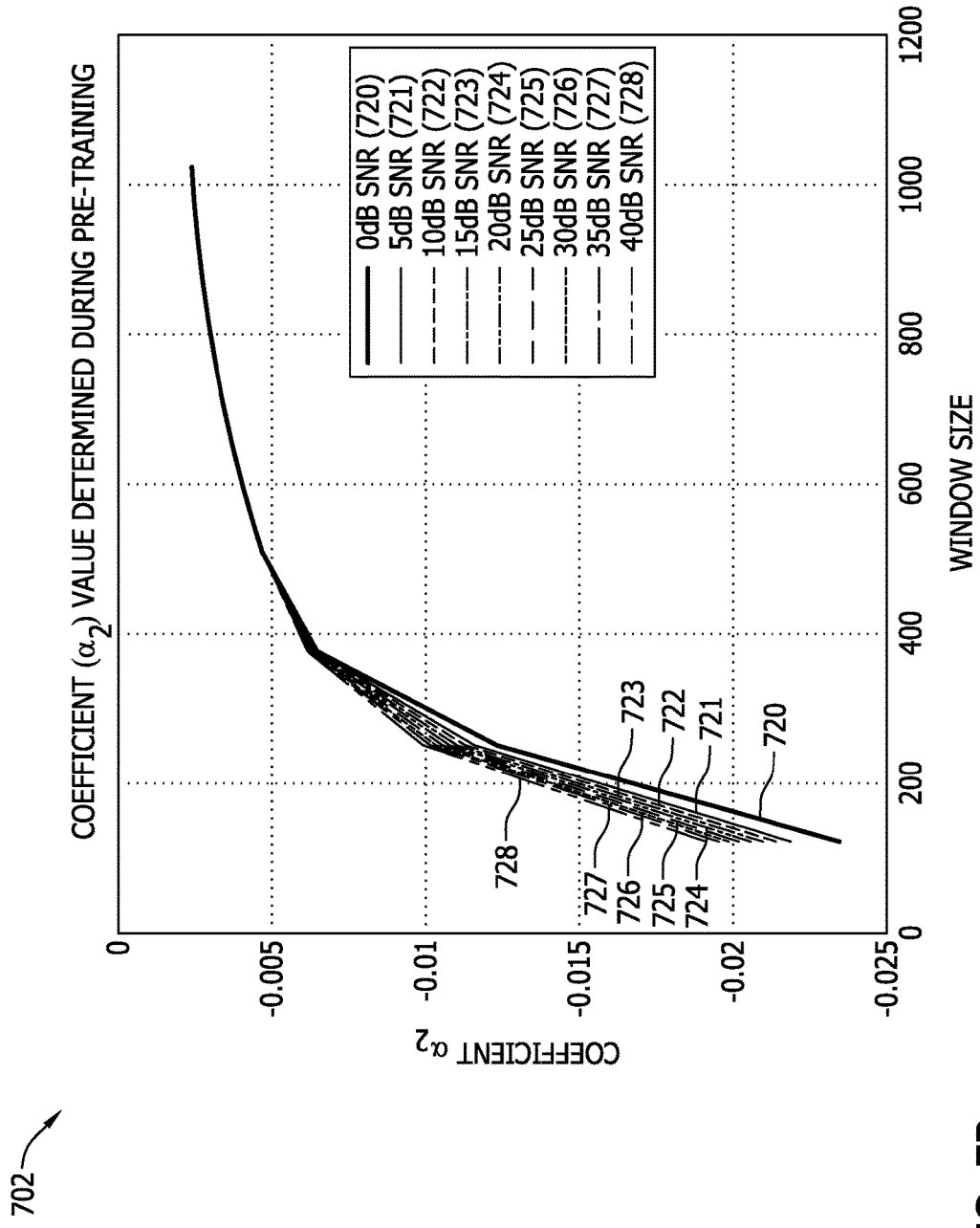
FIG. 7B is a graphical representation of operation of the signal processing system shown in FIG. 1 depicting values for coefficient $\alpha_2$ determined during pre-training versus window size with multiple SNRs.
Figure 7C:
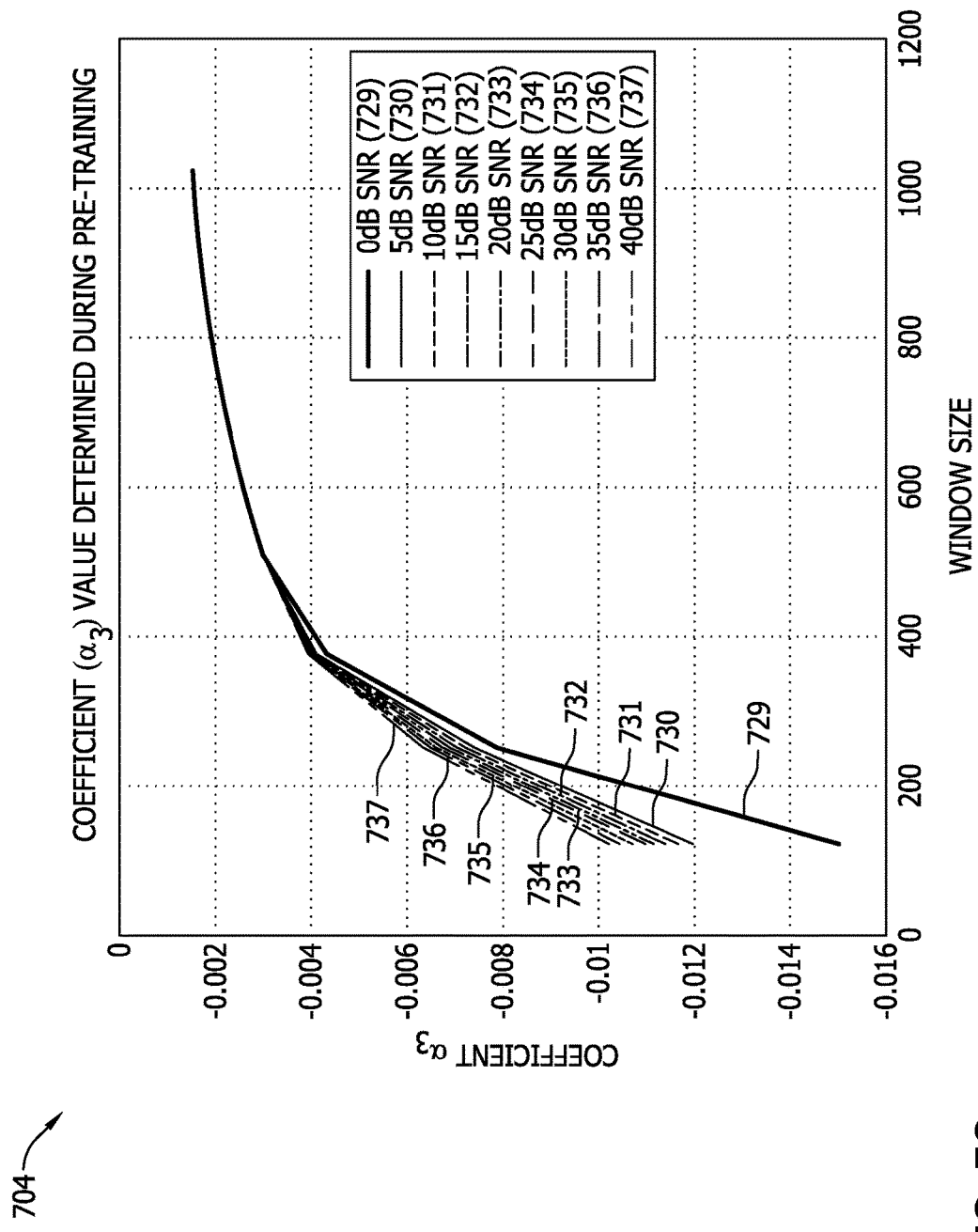
FIG. 7C is a graphical representation of operation of the signal processing system shown in FIG. 1 depicting values for coefficient $\alpha_3$ determined during pre-training versus window size with multiple SNRs.
Figure 7D:
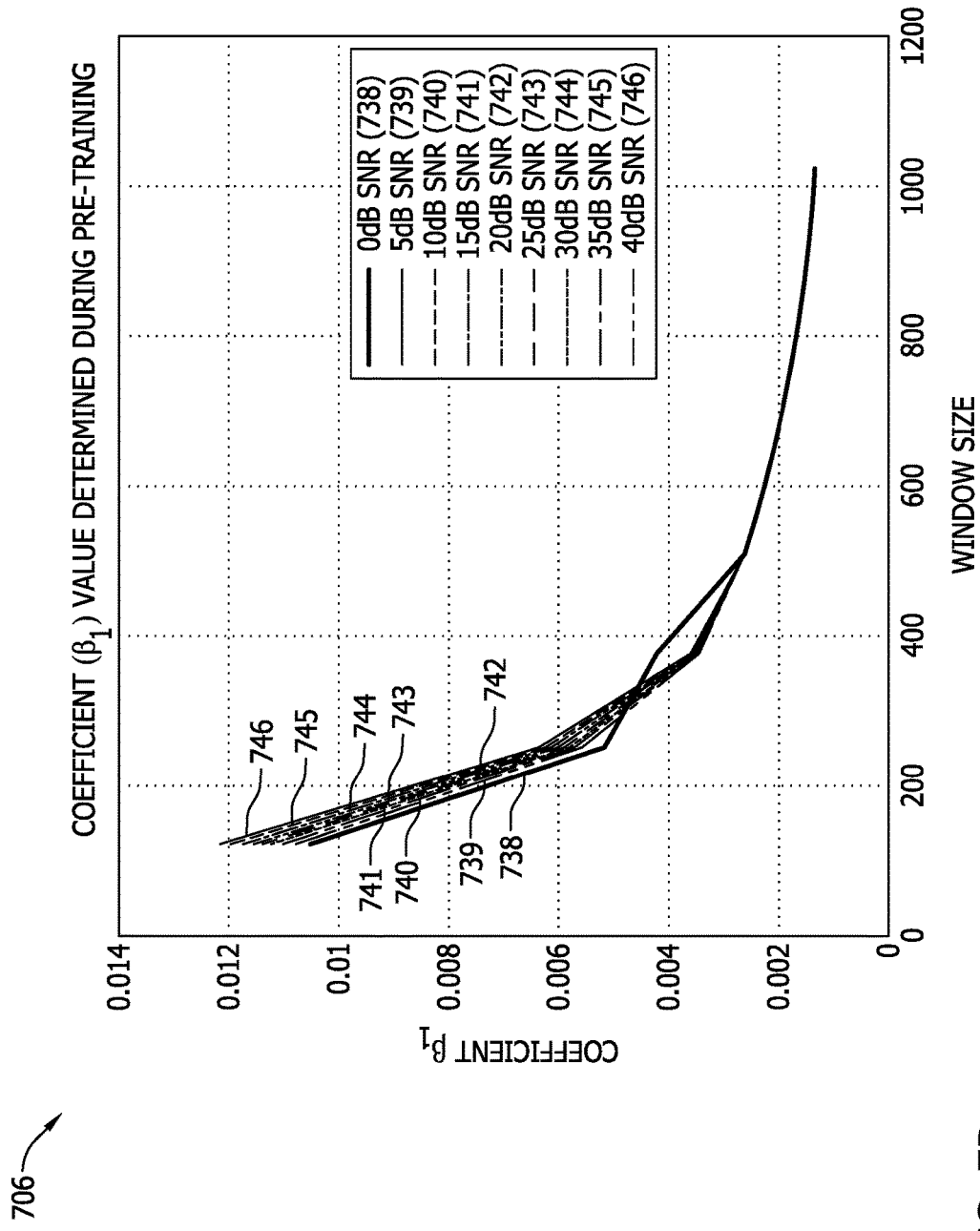
FIG. 7D is a graphical representation of operation of the signal processing system shown in FIG. 1 depicting values for coefficient $\beta_1$ determined during pre-training versus window size with multiple SNRs.
Figure 7E:
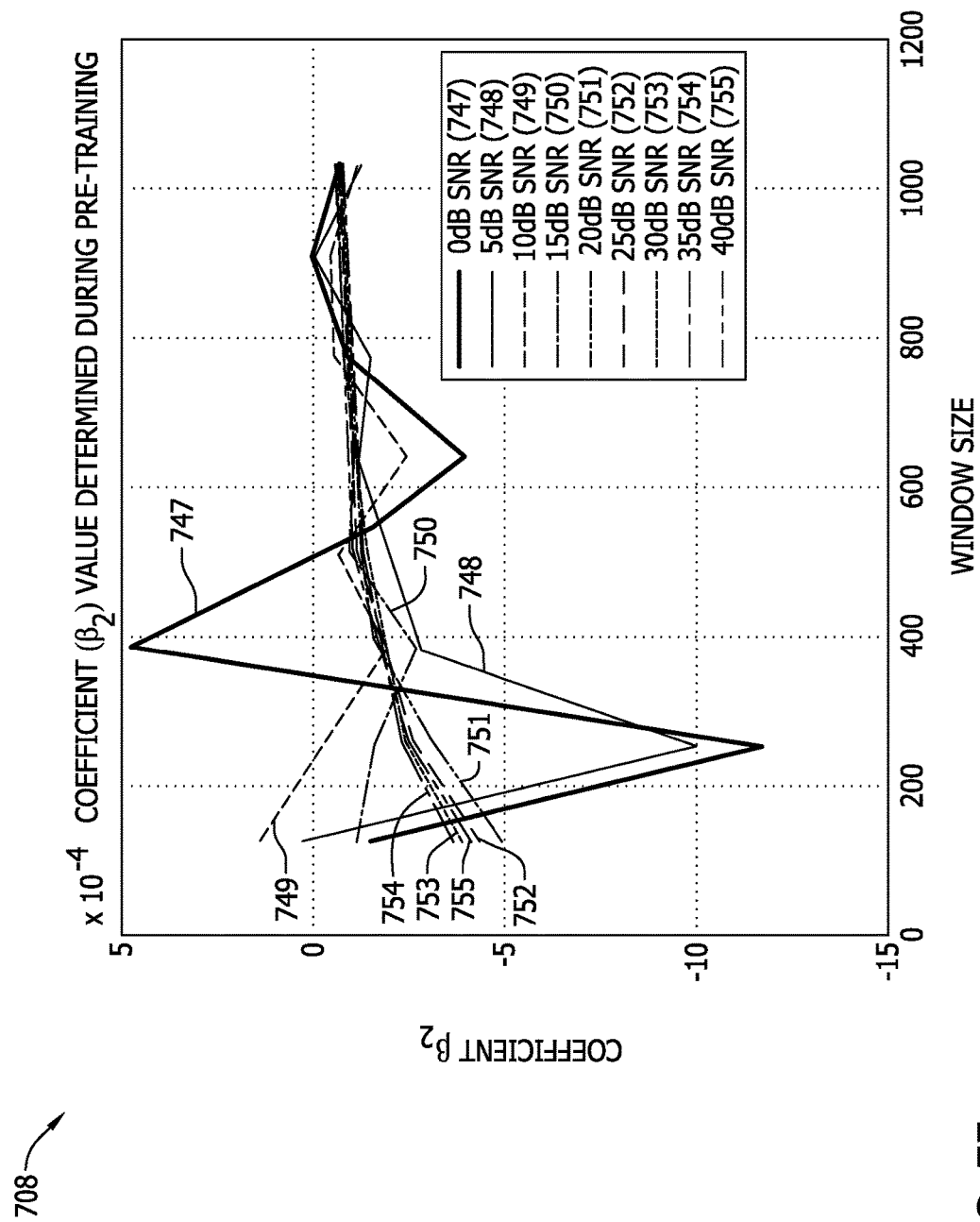
FIG. 7E is a graphical representation of operation of the signal processing system shown in FIG. 1 depicting values for coefficient $\beta_2$ determined during pre-training versus window size with multiple SNRs.
Figure 7F:
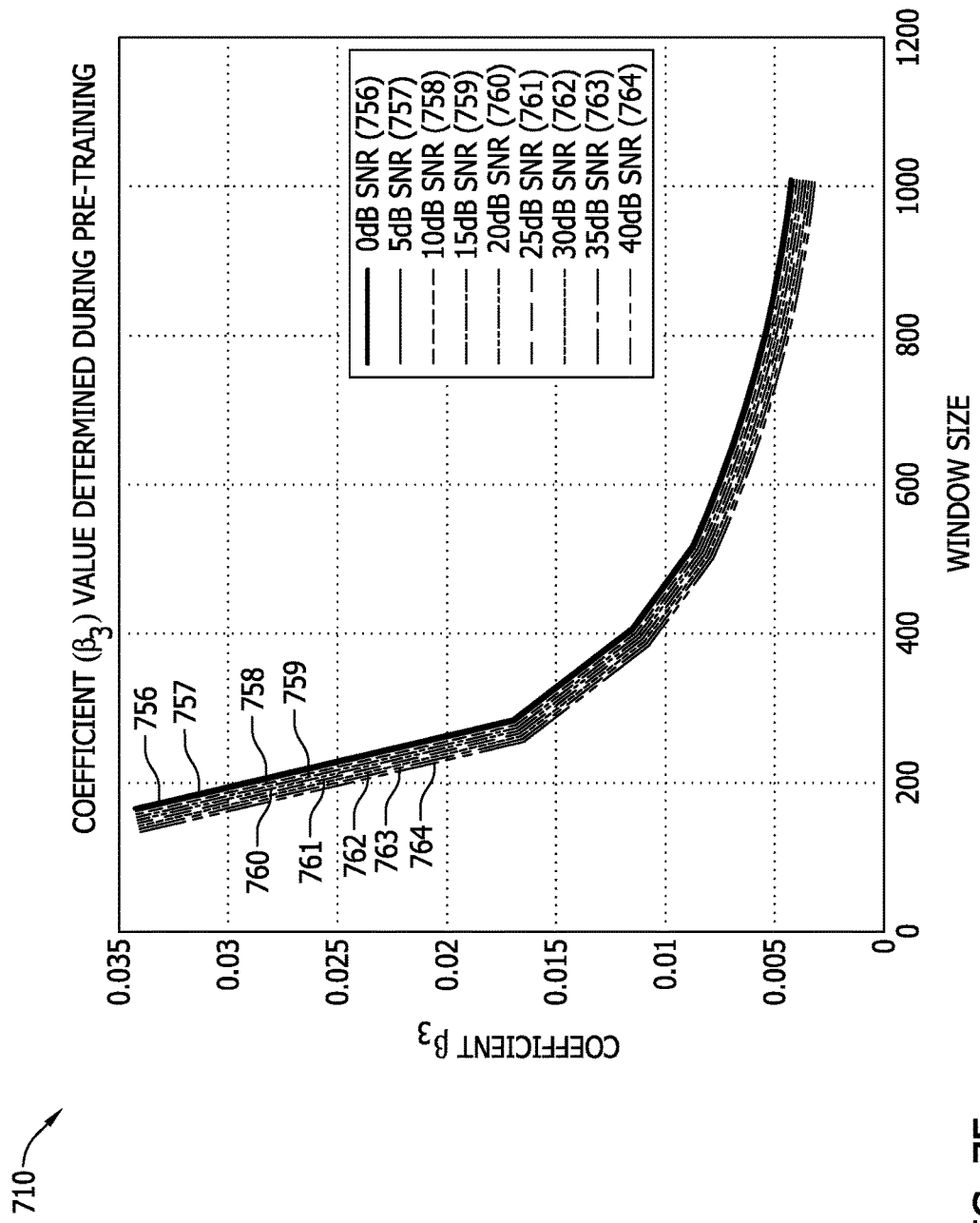
FIG. 7F is a graphical representation of operation of the signal processing system shown in FIG. 1 depicting values for coefficient $\beta_3$ determined during pre-training versus window size with multiple SNRs.

FIG. 7A is a graphical representation (e.g., graph 700) of operation of the signal processing system 100 shown in FIG. 1 depicting values for coefficient $\alpha_1$ determined during pre-training versus window size with multiple SNRs. FIG. 7B is a graphical representation (e.g., graph 702) of operation of the signal processing system 100 shown in FIG. 1 depicting values for coefficient $\alpha_2$ determined during pre-training versus window size with multiple SNRs. FIG. 7C is a graphical representation (e.g., graph 704) of operation of the signal processing system 100 shown in FIG. 1 depicting values for coefficient $\alpha_3$ determined during pre-training versus window size with multiple SNRs. FIG. 7D is a graphical representation (e.g., graph 706) of operation of the signal processing system 100 shown in FIG. 1 depicting values for coefficient $\beta_1$ determined during pre-training versus window size with multiple SNRs. FIG. 7E is a graphical representation (e.g., graph 708) of operation of the signal processing system 100 shown in FIG. 1 depicting values for coefficient $\beta_2$ determined during pre-training versus window size with multiple SNRs. FIG. 7F is a graphical representation (e.g., graph 710) of operation of the signal processing system 100 shown in FIG. 1 depicting values for coefficient $\beta_3$ determined during pre-training versus window size with multiple SNRs.

In the exemplary implementation, graph 700 plots results for coefficient $\alpha_1$ (y-axis) determined at nine different SNRs using the systems and methods described above with reference to FIGS. 1-3. Results of $\alpha_1$ are also plotted in graph 700 over window sizes of approximately 100 to approximately 1000 on the x-axis. Graph 700 includes a first plot 711 of determined $\alpha_1$ values at an SNR of 0 dB. Graph 700 also includes a second plot 712 and a third plot 713 of determined $\alpha_1$ values at SNRs of 5 dB and 10 dB, respectively. Graph 700 further includes a fourth plot 714 and a fifth plot 715 of determined $\alpha_1$ values at SNRs of 15 dB and 20 dB, respectively. Graph 700 also includes a sixth plot 716 and a seventh plot 717 of determined $\alpha_1$ values at SNRs of 25 dB and 30 dB, respectively. Graph 700 further includes an eighth plot 718 and a ninth plot 719 of determined $\alpha_1$ values at SNRs of 35 dB and 40 dB, respectively.

Also, in the exemplary implementation, between window sizes of about 100 and 1000, all plots (711, 712, 713, 714, 715, 716, 717, 718, and 719) of graph 700 are substantially equal in graph 700 and substantially overlap, indicating that determined values of $\alpha_1$ exhibit a substantially similar dependency relationship with respect to window size for all SNRs. The aforementioned dependency relationship indicates that the systems and methods shown and described above with reference to FIGS. 1-3 are implementable with substantially similar benefits in the pre-training process for determining $\alpha_1$ during operation of the exemplary implementation on hardware and processing architectures having varying SNRs depending on particular applications of signal processing system 100.

Further, in the exemplary implementation, graph 702 plots results for coefficient $\alpha_2$ (y-axis) determined at nine different SNRs using the systems and methods described above with reference to FIGS. 1-3. Results of $\alpha_2$ are also plotted in graph 702 over window sizes of approximately 100 to approximately 1000 on the x-axis. Graph 702 includes a tenth plot 720 of determined $\alpha_2$ values at an SNR of 0 dB. Graph 702 also includes an eleventh plot 721 and a twelfth plot 722 of determined $\alpha_2$ values at SNRs of 5 dB and 10 dB, respectively. Graph 702 further includes a thirteenth plot 723 and a fourteenth plot 724 of determined $\alpha_2$ values at SNRs of 15 dB and 20 dB, respectively. Graph 702 also includes a fifteenth plot 725 and a sixteenth plot 726 of determined $\alpha_2$ values at SNRs of 25 dB and 30 dB, respectively. Graph 702 further includes a seventeenth plot 727 and an eighteenth plot 728 of determined $\alpha_2$ values at SNRs of 35 dB and 40 dB, respectively.

Furthermore, in the exemplary implementation, between window sizes of about 100 and 1000, all plots (720, 721, 722, 723, 724, 725, 726, 727, and 728) of graph 702 are substantially equal in graph 702 and substantially overlap, indicating that determined values of $\alpha_2$ exhibit a substantially similar dependency relationship with respect to window size for all SNRs. The aforementioned dependency relationship indicates that the systems and methods shown and described above with reference to FIGS. 1-3 are implementable with substantially similar benefits in the pre-training process for determining $\alpha_2$ during operation of the exemplary implementation on hardware and processing architectures having varying SNRs depending on particular applications of signal processing system 100.

Moreover, in the exemplary implementation, graph 704 plots results for coefficient $\alpha_3$ (y-axis) determined at nine different SNRs using the systems and methods described above with reference to FIGS. 1-3. Results of $\alpha_3$ are also plotted in graph 704 over window sizes of approximately 100 to approximately 1000 on the x-axis. Graph 704 includes a nineteenth plot 729 of determined $\alpha_3$ values at an SNR of 0 dB. Graph 704 also includes a twentieth plot 730 and a twenty-first plot 731 of determined $\alpha_3$ values at SNRs of 5 dB and 10 dB, respectively. Graph 704 further includes a twenty-second plot 732 and a twenty-third plot 733 of determined $\alpha_3$ values at SNRs of 15 dB and 20 dB, respectively. Graph 704 also includes a twenty-fourth plot 734 and a twenty-fifth plot 735 of determined $\alpha_3$ values at SNRs of 25 dB and 30 dB, respectively. Graph 704 further includes a twenty-sixth plot 736 and a twenty-seventh plot 737 of determined $\alpha_3$ values at SNRs of 35 dB and 40 dB, respectively.

Also, in the exemplary implementation, between window sizes of about 400 and 1000, all plots (729, 730, 731, 732, 733, 734, 735, 736, and 737) of graph 704 are substantially equal in graph 704 and substantially overlap, indicating that determined values of $\alpha_3$ exhibit a substantially similar dependency relationship with respect to window size for all SNRs. At windows size values between 100 and 400, on the other hand, all plots (730, 731, 732, 733, 734, 735, 736, and 737) except for nineteenth plot 729 (for 0 dB) are substantially equal and overlapping, again indicating a substantially similar dependency relationship with respect to window size. For nineteenth plot 729, however, determined values of $\alpha_3$ for SNR 0 dB are up to 0.003 different for window sizes of 100 to 400. The aforementioned dependency relationship indicates that the systems and methods shown and described above with reference to FIGS. 1-3 are implementable with substantially similar benefits in the pre-training process for determining $\alpha_3$ during operation of the exemplary implementation on hardware and processing architectures having SNRs ranging from 5 dB to 40 dB depending on particular applications of signal processing system 100.

Further, in the exemplary implementation, graph 706 plots results for coefficient $\beta_1$ (y-axis) determined at nine different SNRs using the systems and methods described above with reference to FIGS. 1-3. Results of $\beta_1$ are also plotted in graph 706 over window sizes of approximately 100 to approximately 1000 on the x-axis. Graph 706 includes a twenty-eighth plot 738 of determined $\beta_1$ values at an SNR of 0 dB. Graph 706 also includes a twenty-ninth plot 739 and a thirtieth plot 740 of determined $\beta_1$ values at SNRs of 5 dB and 10 dB, respectively. Graph 706 further includes a thirty-first plot 741 and a thirty-second plot 742 of determined $\beta_1$ values at SNRs of 15 dB and 20 dB, respectively. Graph 706 also includes a thirty-third plot 743 and a thirty-fourth plot 744 of determined $\beta_1$ values at SNRs of 25 dB and 30 dB, respectively. Graph 706 further includes a thirty-fifth plot 745 and a thirty-sixth plot 746 of determined $\beta_1$ values at SNRs of 35 dB and 40 dB, respectively.

Furthermore, in the exemplary implementation, between window sizes of about 100 and 1000, all plots (738, 739, 740, 741, 742, 743, 744, 745, and 746) of graph 706 are substantially equal in graph 706 and substantially overlap, indicating that determined values of $\beta_1$ exhibit a substantially similar dependency relationship with respect to window size for all SNRs. The aforementioned dependency relationship indicates that the systems and methods shown and described above with reference to FIGS. 1-3 are implementable with substantially similar benefits in the pre-training process for determining $\beta_1$ during operation of the exemplary implementation on hardware and processing architectures having varying SNRs depending on particular applications of signal processing system 100.

Moreover, in the exemplary implementation, graph 708 plots results for coefficient $\beta_2$ (y-axis) determined at nine different SNRs using the systems and methods described above with reference to FIGS. 1-3. Results of $\beta_2$ are also plotted in graph 708 over window sizes of approximately 100 to approximately 1000 on the x-axis. Graph 708 includes a thirty-seventh plot 747 of determined $\beta_2$ values at an SNR of 0 dB. Graph 708 also includes a thirty-eighth plot 748 and a thirty-ninth plot 749 of determined $\beta_2$ values at SNRs of 5 dB and 10 dB, respectively. Graph 708 further includes a fortieth plot 750 and a forty-first plot 751 of determined $\beta_2$ values at SNRs of 15 dB and 20 dB, respectively. Graph 708 also includes a forty-second plot 752 and a forty-third plot 753 of determined $\beta_2$ values at SNRs of 25 dB and 30 dB, respectively. Graph 708 further includes a forty-fourth plot 754 and a forty-fifth plot 755 of determined $\beta_2$ values at SNRs of 35 dB and 40 dB, respectively.

Also, in the exemplary implementation, plots (751, 752, 753, 754, and 755) of graph 708 are substantially equal in graph 708 and substantially overlap, indicating that determined values of $\beta_2$ exhibit a substantially similar dependency relationship with respect to window size for SNRs of 20 dB to 40 dB between window sizes of about 100 and 1000. For lower SNR plots (747, 748, 749, and 750) for window sizes 100 to 1000, however, determined values of $\beta_2$ exhibit significant variation from plots (751, 752, 753, 754, and 755) by up to about 10. The aforementioned dependency relationship indicates that the systems and methods shown and described above with reference to FIGS. 1-3 are implementable with substantially similar benefits in the pre-training process for determining $\beta_2$ during operation of the exemplary implementation on hardware and processing architectures having SNRs ranging from 20 dB to 40 dB depending on particular applications of signal processing system 100.

Further, in the exemplary implementation, graph 710 plots results for coefficient $\beta_3$ (y-axis) determined at nine different SNRs using the systems and methods described above with reference to FIGS. 1-3. Results of $\beta_3$ are also plotted in graph 710 over window sizes of approximately 100 to approximately 1000 on the x-axis. Graph 710 includes a forty-sixth plot 756 of determined $\beta_3$ values at an SNR of 0 dB. Graph 710 also includes a forty-seventh plot 757 and a forty-eighth plot 758 of determined $\beta_3$ values at SNRs of 5 dB and 10 dB, respectively. Graph 710 further includes a forty-ninth plot 759 and a fiftieth plot 760 of determined $\beta_3$ values at SNRs of 15 dB and 20 dB, respectively. Graph 710 also includes a fifty-first plot 761 and a fifty-second plot 762 of determined $\beta_3$ values at SNRs of 25 dB and 30 dB, respectively. Graph 710 further includes a fifty-third plot 763 and a fifty-fourth plot 764 of determined $\beta_3$ values at SNRs of 35 dB and 40 dB, respectively.

Furthermore, in the exemplary implementation, between window sizes of about 100 and 1000, all plots (756, 757, 758, 759, 760, 761, 762, 763, and 764) of graph 710 are substantially equal in graph 710 and substantially overlap, indicating that determined values of $\beta_3$ exhibit a substantially similar dependency relationship with respect to window size for all SNRs. The aforementioned dependency relationship indicates that the systems and methods shown and described above with reference to FIGS. 1-3 are implementable with substantially similar benefits in the pre-training process for determining $\beta_3$ during operation of the exemplary implementation on hardware and processing architectures having varying SNRs depending on particular applications of signal processing system 100.

Figure 8A:
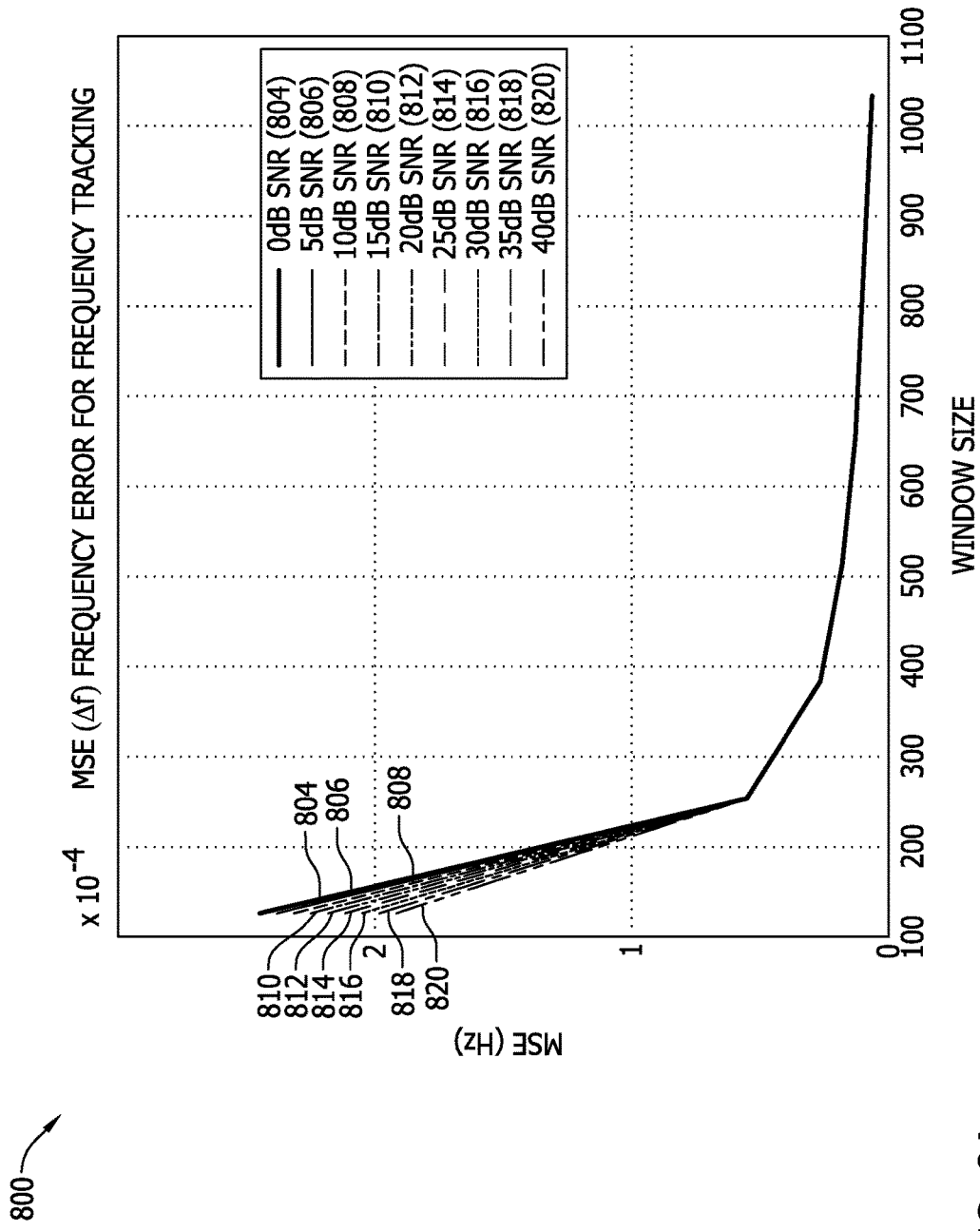
FIG. 8A is a graphical representation of operation of the signal processing system shown in FIG. 1 depicting MSE results for frequency error ($\Delta f$) determined during frequency tracking versus window size with multiple SNRs.
Figure 8B:
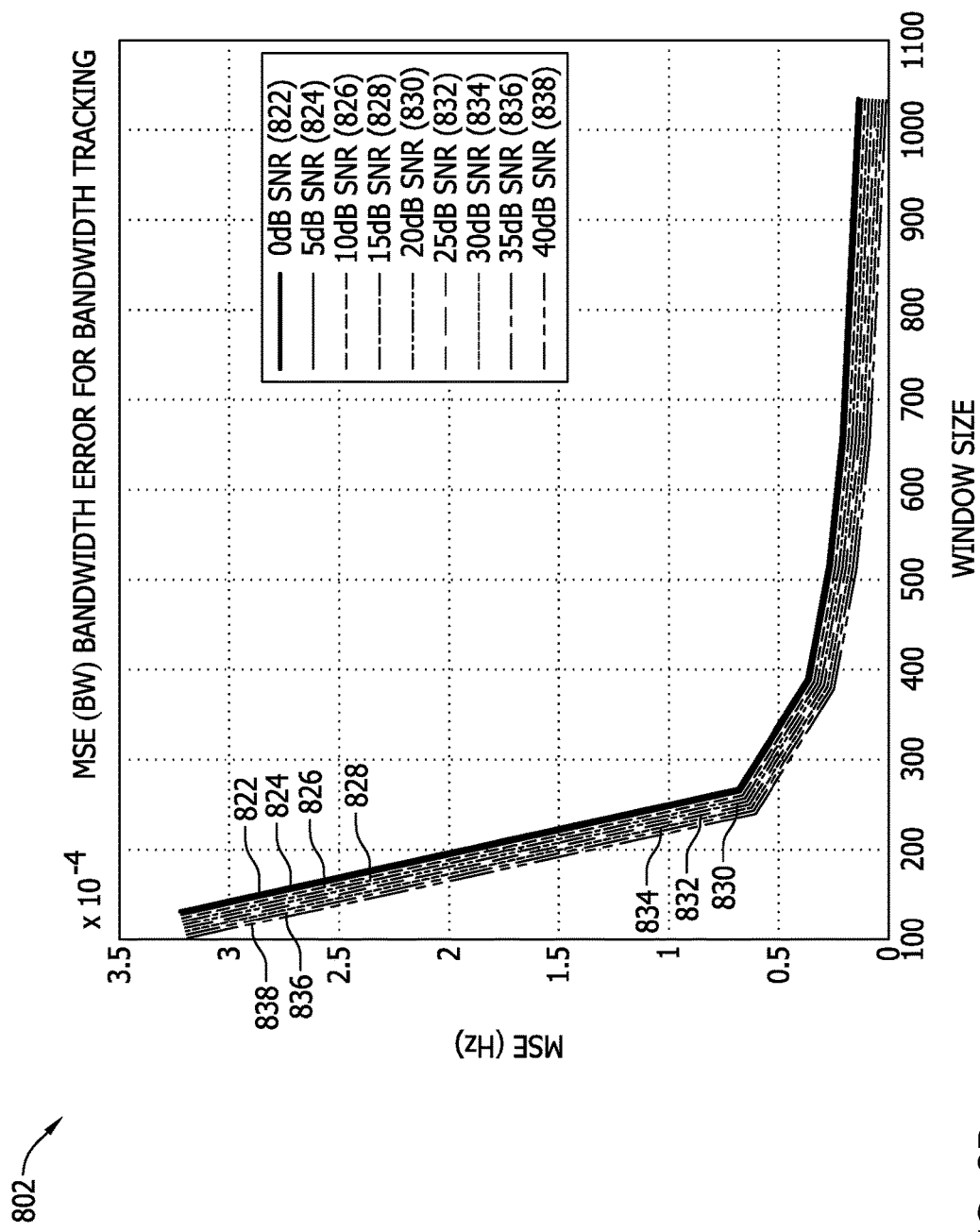
FIG. 8B is a graphical representation of operation of the signal processing system shown in FIG. 1 depicting MSE results for bandwidth error ($\Delta w$) determined during frequency tracking versus window size with multiple SNRs.

FIG. 8A is a graphical representation (e.g., graph 800) of operation of the signal processing system 100 shown in FIG. 1 depicting MSE results for $\Delta f$ determined during frequency tracking versus window size with multiple SNRs. FIG. 8B is a graphical representation (e.g., graph 802) of operation of the signal processing system 100 shown in FIG. 1 depicting MSE results for $\Delta w$ determined during frequency tracking versus window size with multiple SNRs. In the exemplary implementation, graph 800 plots results for MSE of $\Delta f$ (y-axis) determined for nine different SNRs using the systems and methods described above with reference to FIGS. 1-3. Results of MSE of $\Delta f$ are also plotted in graph 800 over window sizes of 100 to about 1050 on the x-axis. Graph 800 includes a first plot 804 of determined MSE of $\Delta f$ values at an SNR of 0 dB. Graph 800 also includes a second plot 806 and a third plot 808 of determined MSE of $\Delta f$ values at SNRs of 5 dB and 10 dB, respectively. Graph 800 further includes a fourth plot 810 and a fifth plot 812 of determined MSE of $\Delta f$ values at SNRs of 15 dB and 20 dB, respectively. Graph 800 also includes a sixth plot 814 and a seventh plot 816 of determined MSE of $\Delta f$ values at SNRs of 25 dB and 30 dB, respectively. Graph 800 further includes an eighth plot 818 and a ninth plot 820 of determined MSE of $\Delta f$ values at SNRs of 30 dB and 35 dB, respectively. Also, in the exemplary implementation, all plots (804, 806, 808, 810, 812, 814, 816, 818, and 820) of graph 800 are substantially equal in graph 800 and substantially overlap, indicating that determined values of MSE of $\Delta f$ exhibit a substantially similar dependency relationship with respect to window size for all SNRs. The aforementioned dependency relationship indicates that the systems and methods shown and described above with reference to FIGS. 1-3 are implementable with substantially similar benefits in operation of the exemplary implementation on hardware and processing architectures having varying SNRs depending on particular applications of signal processing system 100.

Further, in the exemplary implementation, graph 802 plots results for MSE of $\Delta w$ (y-axis) determined for nine different SNRs using the systems and methods described above with reference to FIGS. 1-3. Results of MSE of $\Delta w$ are also plotted in graph 802 over window sizes of 100 to about 1050 on the x-axis. Graph 802 includes a tenth plot 822 of determined MSE of $\Delta w$ values at an SNR of 0 dB. Graph 802 also includes an eleventh plot 824 and a twelfth plot 826 of determined MSE of $\Delta w$ values at SNRs of 5 dB and 10 dB, respectively. Graph 802 further includes a thirteenth plot 828 and a fourteenth plot 830 of determined MSE of $\Delta w$ values at SNRs of 15 dB and 20 dB, respectively. Graph 802 also includes a fifteenth plot 832 and a sixteenth plot 834 of determined MSE of $\Delta w$ values at SNRs of 25 dB and 30 dB, respectively. Graph 802 further includes a seventeenth plot 836 and an eighteenth plot 838 of determined MSE of $\Delta w$ values at SNRs of 30 dB and 35 dB, respectively. Also, in the exemplary implementation, all plots (822, 824, 826, 828, 830, 832, 834, 836, and 838) of graph 802 are substantially equal in graph 802 and substantially overlap, indicating that determined values of MSE of $\Delta w$ exhibit a substantially similar dependency relationship with respect to window size for all SNRs. The aforementioned dependency relationship indicates that the systems and methods shown and described above with reference to FIGS. 1-3 are implementable with substantially similar benefits in operation of the exemplary implementation on hardware and processing architectures having varying SNRs depending on particular applications of signal processing system 100.

Figure 9:
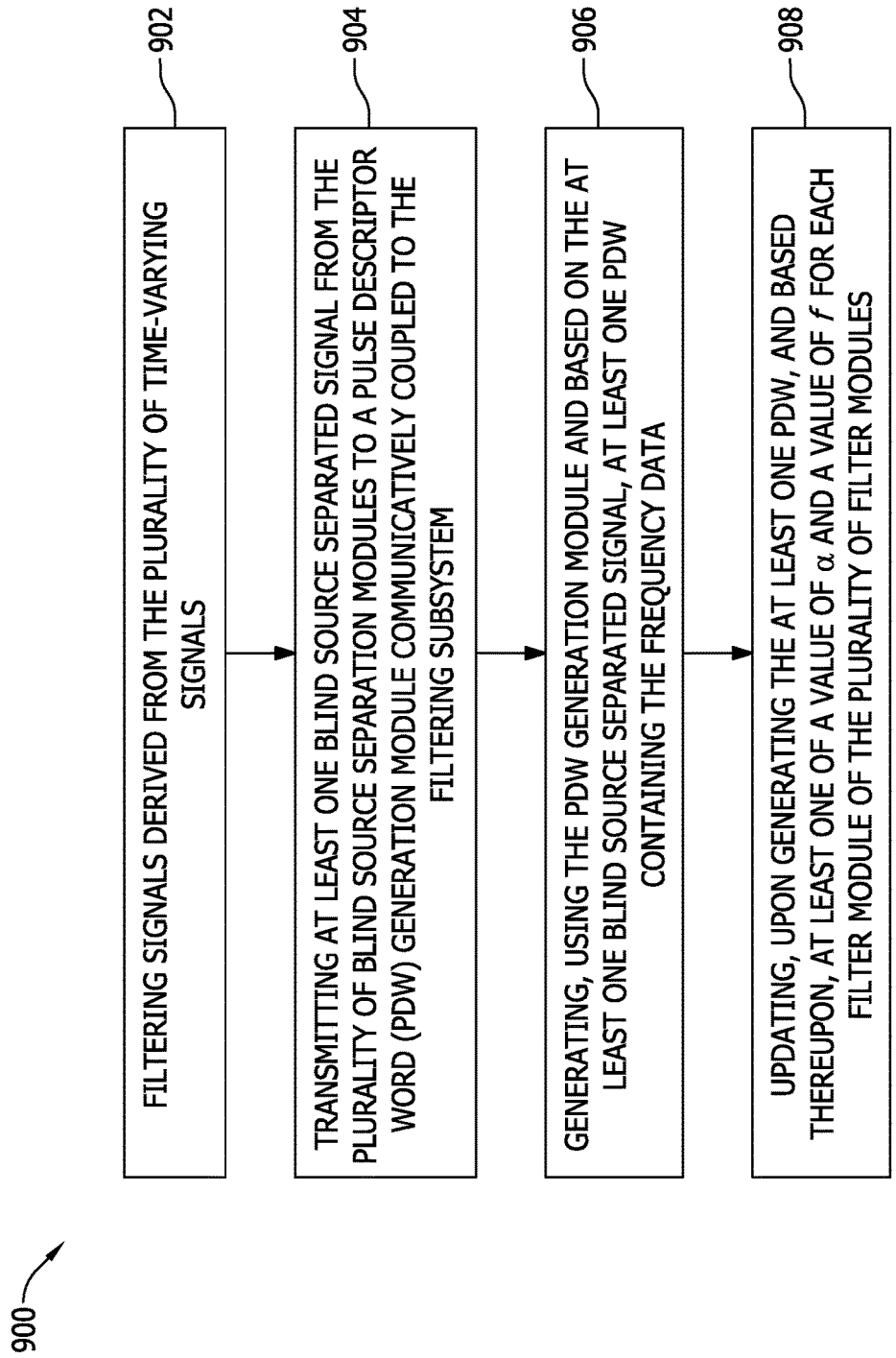
FIG. 9 is a flowchart of an exemplary method of PDW generation using BSS that may be used with the signal processing system shown in FIG. 1.

FIG. 9 is a flowchart of an exemplary method 900 for generating PDWs using BSS that may be used with the signal processing system 100 shown in FIG. 1. In the exemplary implementation, method 900 includes filtering 902, at the plurality of BSS modules 120 of the signal data processor 101, signals (e.g., denoised signals 124 and state energy signals 126) derived from the plurality of time-varying signals (e.g., first 114 and second 116 radar signals). Method 900 also includes transmitting 904 at least one blind source separated signal 129 from the plurality of BSS modules 120 to the PDW generation module 128 communicatively coupled to filtering subsystem 207. Method 900 further includes generating 906, using the PDW generation module 128 and based on the at least one blind source separated signal 129, at least one PDW parameter vector signal 138 containing the frequency data. Method 900 also includes updating 908, upon generating the at least one PDW parameter vector signal 138, and based thereupon, at least one of a value of α and a value of f for each filter module of the plurality of filter modules (e.g., low filter module 222, main filter module 224, and high filter module 226).

The above-described systems and methods for PDW generation using blind source separation enable enhanced accuracy of PDW parameter estimations without relying on fixed bandwidth channels. The above-described implementations also facilitate faster and more efficient PDW generation using less complex processing architectures relative to known fixed bandwidth channel-based systems. The above-described implementations further enable reduction of size, weight, and cost of high performance PDW signal processing systems and methods. The above-described systems and methods for PDW generation using blind source separation also provide continuous high speed generation of high signal quality PDW vectors suitable for improved deinterleaving methods.

An exemplary technical effect of the above-described systems and methods for PDW generation using blind source separation includes at least one of the following: (a) enhancing accuracy of PDW parameter estimations without relying on fixed bandwidth channels; (b) increasing speed and efficiency of PDW generation using less complex processing architectures relative to known systems; (c) reducing size, weight, and cost of high performance PDW signal processing systems; and (d) providing continuous high speed generation of high signal quality PDW vectors suitable for improved deinterleaving methods.

Although specific features of various implementations of the disclosure may be shown in some drawings and not in others, this is for convenience only. In accordance with the principles of the disclosure, any feature of a drawing may be referenced and/or claimed in combination with any feature of any other drawing.

Some implementations involve the use of one or more electronic or computing devices. Such devices typically include a processor, processing device, or controller, such as a general purpose central processing unit (CPU), a graphics processing unit (GPU), a microcontroller, a reduced instruction set computer (RISC) processor, an ASIC, a programmable logic circuit (PLC), an FPGA, a DSP device, and/or any other circuit or processing device capable of executing the functions described herein. The methods described herein may be encoded as executable instructions embodied in a computer-readable medium, including, without limitation, a storage device and/or a memory device. Such instructions, when executed by a processing device, cause the processing device to perform at least a portion of the methods described herein. The above examples are exemplary only, and thus are not intended to limit in any way the definition and/or meaning of the term processor and processing device.

This written description uses examples to disclose the implementations, including the best mode, and also to enable any person skilled in the art to practice the implementations, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A method for generating pulse descriptor words ("PDWs") including at least one of frequency data and bandwidth data, from a plurality of time-varying signals using a signal data processor, said method comprising:
   filtering, at a plurality of blind source separation ("BSS") modules of the signal data processor, signals derived from the plurality of time-varying signals, each BSS module of the plurality of BSS modules including a filtering subsystem having a plurality of filter modules, wherein each filter module of the plurality of filter modules has a frequency filter coefficient ("α") and is parameterized by a center frequency ("f");
   transmitting at least one blind source separated signal from the plurality of BSS modules to a PDW generation module communicatively coupled to the filtering subsystem;
   generating, using the PDW generation module and based on the at least one blind source separated signal, at least one PDW parameter vector signal containing the frequency data;
   updating, upon generating the at least one PDW parameter vector signal, and based thereupon, at least one of a value of a and α value of f for each filter module of the plurality of filter modules;
   outputting the at least one PDW parameter vector signal from the PDW generation module to a computing device communicatively coupled to the signal data processor; and
   directing movement of a vehicle based on the at least one PDW parameter vector signal.

2. The method in accordance with claim 1 further comprising storing, in a memory communicatively coupled to the signal data processor, at least one of an updated value of α and an updated value of f, wherein updating at least one of the value of α and the value of f comprises transmitting at least one of the updated value of α and the updated value of f to the each filter module to facilitate tracking the frequency data for the plurality of time-varying signals.

3. The method in accordance with claim 1 further comprising storing, in a memory communicatively coupled to the signal data processor, at least one of an initial value of α and an initial value of f.

4. The method in accordance with claim 1, wherein filtering signals comprises receiving denoised signals and state energy signals from at least one signal denoising module, said method further comprising determining a value of signal energy of the signals to facilitate tracking at least one of the frequency data and the bandwidth data for the plurality of time-varying signals.

5. The method in accordance with claim 1, wherein filtering the signals comprises using at least one filter module of the plurality of filter modules having a bandwidth filter coefficient ("β") and further parameterized by a bandwidth ("w"), and wherein said method further comprises updating at least one of a value of β and a value of w of the at least one filter module.

6. The method in accordance with claim 5 further comprising storing, in a memory communicatively coupled to the signal data processor, at least one of an updated value of β and an updated value of w, wherein updating at least one of the value of β and the value of w comprises transmitting at least one of the updated value of β and the updated value of w to the each filter module to facilitate tracking the bandwidth data for the plurality of time-varying signals.

7. The method in accordance with claim 5 further comprising storing, in a memory communicatively coupled to the signal data processor, at least one of an initial value of β and an initial value of w.

8. The method in accordance with claim 1 further comprising displaying at least one of the at least one PDW parameter vector signal and information derived therefrom on a display.

9. A system for processing a plurality of time-varying signals to generate at least one pulse descriptor word ("PDW") including at least one of frequency data and bandwidth data, said system comprising:
a sensor configured to receive the at least one time-varying signal;
a signal data processor communicatively coupled to said sensor and comprising:
a plurality of blind source separation ("BSS") modules, each BSS module of said plurality of BSS modules comprising a filtering subsystem comprising a plurality of filter modules, wherein each filter module of said plurality of filter modules has a frequency filter coefficient ("α") and is parameterized by a center frequency ("f"); and
a PDW generation module communicatively coupled to said filtering subsystem, said plurality of BSS modules configured to filter signals derived from the plurality of time-varying signals and transmit at least one blind source separated signal to said PDW generation module, said PDW generation module configured to generate, based on the at least one blind source separated signal, at least one PDW parameter vector signal containing the frequency data to facilitate updating, substantially simultaneously with generating the at least one PDW parameter vector signal, and based thereupon, at least one of a value of α and a value of f for each filter module of said plurality of filter modules;
a computing device communicatively coupled to said signal data processor, said computing device configured to receive the at least one PDW parameter vector signal from said PDW generation module; and
a vehicle in communication with said computing device, said system configured to direct movement of said vehicle based on the at least one PDW parameter vector signal.

10. The system in accordance with claim 9 further comprising a memory configured to store at least one of an updated value of α and an updated value of f, wherein said each filter module is configured to receive at least one of the updated value of α and the updated value of f to facilitate tracking the frequency data for the plurality of time-varying signals.

11. The system in accordance with claim 10 wherein said computing device is communicatively coupled to said memory, said computing device further configured to:
deinterleave the at least one PDW parameter vector signal; and
transmit at least one frequency word signal to said signal data processing to further facilitate updating, substantially simultaneously with generating the at least one PDW parameter vector signal, and based thereupon, at least one of the value of α and the value of f for said each filter module.

12. The system in accordance with claim 11 further comprising a display communicatively coupled to said computing device, said computing device configured to display at least one of the at least one PDW parameter vector signal and information derived therefrom on said display.

13. The system in accordance with claim 9 further comprising at least one signal denoising module configured to generate denoised signals and state energy signals derived from the plurality of time-varying signals, said system configured to determine a value of signal energy of the signals to facilitate tracking at least one of the frequency data and the bandwidth data for the plurality of time-varying signals.

14. The system in accordance with claim 9, wherein at least one filter module of said plurality of filter modules has a bandwidth filter coefficient ("β") and is further parameterized by a bandwidth ("w"), the at least one PDW parameter vector signal further containing the bandwidth data to facilitate updating, substantially simultaneously with generating the at least one PDW parameter vector signal, and based thereupon, at least one of a value of β and a value of w of said at least one filter module.

15. The system in accordance with claim 14 further comprising a memory configured to store at least one of an updated value of β and an updated value of w, wherein said at least one filter module is configured to receive at least one of the updated value of β and the updated value of w to facilitate tracking the bandwidth data for the plurality of time-varying signals.

16. A signal data processor for processing a plurality of time-varying signals to generate at least one pulse descriptor word ("PDW") including at least one of frequency data and bandwidth data, said signal data processor comprising:
a plurality of blind source separation ("BSS") modules, each BSS module of said plurality of BSS modules comprising a filtering subsystem comprising a plurality of filter modules, wherein each filter module of said plurality of filter modules has a frequency filter coefficient ("α") and is parameterized by a center frequency ("f"); and
a PDW generation module communicatively coupled to said filtering subsystem, said plurality of BSS modules configured to filter signals derived from the plurality of time-varying signals and transmit at least one blind source separated signal to said PDW generation module, said PDW generation module configured to generate, based on the at least one blind source separated signal, at least one PDW parameter vector signal containing the frequency data to facilitate updating, substantially simultaneously with generating the at least one PDW parameter vector signal, and based thereupon, at least one of a value of α and a value of f for each filter module of said plurality of filter modules, wherein said PDW generation module is configured to output the at least one PDW parameter vector signal to a computing device to direct movement of a vehicle based on the at least one PDW parameter vector signal.

17. The signal data processor in accordance with claim 16 further comprising at least one signal denoising module configured to generate denoised signals and state energy signals derived from the plurality of time-varying signals, said signal processing system configured to determine a value of signal energy of the signals to facilitate tracking at least one of the frequency data and the bandwidth data for the plurality of time-varying signals.

18. The signal data processor in accordance with claim 16, wherein at least one filter module of said plurality of filter modules has a bandwidth filter coefficient ("β") and is further parameterized by a bandwidth ("w"), the at least one PDW parameter vector signal further containing the bandwidth data to facilitate updating, substantially simultaneously with generating the at least one PDW parameter vector signal, and based thereupon, at least one of a value of $\beta$ and a value of w of said at least one filter module.

* * * * *